United States Patent
Terai et al.

(10) Patent No.: US 9,741,764 B1
(45) Date of Patent: Aug. 22, 2017

(54) MEMORY DEVICE INCLUDING OVONIC THRESHOLD SWITCH ADJUSTING THRESHOLD VOLTAGE THEREOF

(71) Applicant: Samsung Electronics Co., Ltd., Suwon-si (KR)

(72) Inventors: Masayuki Terai, Suwon-si (KR); Gwan-hyeob Koh, Seoul (KR); Dae-hwan Kang, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/257,609

(22) Filed: Sep. 6, 2016

(30) Foreign Application Priority Data

Feb. 22, 2016 (KR) .................. 10-2016-0020680
Apr. 25, 2016 (KR) .................. 10-2016-0050113

(51) Int. Cl.
*H01L 27/00* (2006.01)
*H01L 27/24* (2006.01)
(Continued)

(52) U.S. Cl.
CPC ...... *H01L 27/2427* (2013.01); *G11C 13/0002* (2013.01); *H01L 27/0688* (2013.01);
(Continued)

(58) Field of Classification Search
CPC ............ G11C 2213/71; G11C 2213/79; G11C 13/0002; H01L 27/2481; H01L 27/249;
(Continued)

(56) References Cited

U.S. PATENT DOCUMENTS 8,084,789 B2   12/2011   Pellizzer et al.
8,541,768 B2    9/2013   Shima et al.
(Continued)

FOREIGN PATENT DOCUMENTS

KR   10-2013-0095432 A   8/2013

OTHER PUBLICATIONS

Daniele Ielmini et al. / Analytical model for subthreshold conduction and threshold switching in chalcogenide-based memory devices / Journal of Applied Physics 102, 2007 / 14 Pages.
Lee et al. / Highly-Scalable Threshold Switching Select Device based on Chaclogenide Glasses for 3D Nanoscaled Memory Arrays / IEEE 2012 / 3 Pages.

*Primary Examiner* — Ngan Ngo
(74) *Attorney, Agent, or Firm* — Muir Patent Law, PLLC

(57) ABSTRACT

A memory device may include a substrate, a first conductive line on the substrate and extending in a first direction, a second conductive line over the first conductive line and extending in a second direction crossing the first direction, a third conductive line over the second conductive line and extending in the first direction, a first memory cell at an intersection of the first conductive line and the second conductive line and including a first selection element layer and a first variable resistance layer, and a second memory cell at an intersection of the second conductive line and the third conductive line and including a second selection element layer and a second variable resistance layer. A first height of the first selection element layer in a third direction perpendicular to the first and second directions is different than a second height of the second selection element layer in the third direction.

20 Claims, 27 Drawing Sheets

(51) Int. Cl.
*H01L 45/00* (2006.01)
*H01L 27/11582* (2017.01)
*H01L 27/10* (2006.01)
*G11C 13/00* (2006.01)
*H01L 27/06* (2006.01)

(52) U.S. Cl.
CPC ...... *H01L 27/101* (2013.01); *H01L 27/11582* (2013.01); *H01L 27/249* (2013.01); *H01L 27/2445* (2013.01); *H01L 27/2454* (2013.01); *H01L 27/2481* (2013.01); *H01L 45/126* (2013.01); *H01L 45/1233* (2013.01); *G11C 2213/17* (2013.01); *G11C 2213/79* (2013.01)

(58) Field of Classification Search
CPC ........... H01L 27/2454; H01L 27/11582; H01L 27/0688; H01L 27/101
See application file for complete search history.

(56) References Cited

U.S. PATENT DOCUMENTS

| | | |
|---|---|---|
| 8,735,861 B2 | 5/2014 | Noda |
| 9,054,295 B2 | 6/2015 | Gotti et al. |
| 2009/0196091 A1 | 8/2009 | Kau et al. |
| 2013/0062589 A1 | 3/2013 | Yasutake et al. |
| 2013/0320286 A1 | 12/2013 | Lee et al. |
| 2014/0061566 A1 | 3/2014 | Noda |
| 2014/0291604 A1 | 10/2014 | Pellizzer et al. |
| 2014/0374686 A1 | 12/2014 | Pangal et al. |
| 2015/0207066 A1 | 7/2015 | Ohba et al. |
| 2017/0040339 A1* | 2/2017 | Lee .................... H01L 27/11582 |
| 2017/0062330 A1* | 3/2017 | Kim .................... H01L 23/5226 |

* cited by examiner

MEMORY DEVICE INCLUDING OVONIC THRESHOLD SWITCH ADJUSTING THRESHOLD VOLTAGE THEREOF

CROSS-REFERENCE TO RELATED APPLICATIONS

This application claims priority under 35 U.S.C. §119 to Korean Patent Application No. 10-2016-0020680, filed on Feb. 22, 2016, and Korean Patent Application No. 10-2016-0050113, filed on Apr. 25, 2016 in the Korean Intellectual Property Office, the disclosures of which are incorporated herein in their entirety by reference.

BACKGROUND

Technical Field

Embodiments of the present disclosure relate to memory devices. More specifically, embodiments of the present disclosure relate to memory devices having a cross-point structure.

Description of Related Art

The integration of semiconductor memory devices has been increased as sizes of the electronic devices have been reduced. Thus, three-dimensional cross-point memory devices which include a plurality of memory cells disposed at intersection points of two electrodes crossing each other have been studied to be scaled down. However, in the down-scaling process, since thicknesses of layers used to form the three-dimensional cross-point array memory devices also are reduced, the layers exposed to high temperature processes can be easily damaged and degraded. Therefore, electrical characteristics of the three dimensional cross-point memory devices may be degraded.

SUMMARY

According to example embodiments, a memory device may include a substrate, a plurality of first conductive lines on the substrate, which extend in a first direction parallel to a top surface of the substrate and are spaced apart from each other in a second direction crossing the first direction, a plurality of second conductive lines over the plurality of first conductive lines, which extend in the second direction and are spaced apart from each other in the first direction, a plurality of third conductive lines over the plurality of second conductive lines, which extend in the first direction and are spaced apart from each other in the second direction, a plurality of first memory cells at respective intersections of the plurality of first conductive lines and the plurality of second conductive lines, each of which includes a first selection element layer and a first variable resistance layer, and a plurality of second memory cells at respective intersections of the plurality of second conductive lines and the plurality of third conductive lines, each of which includes a second selection element layer and a second variable resistance layer. A first height of the first selection element layer in a third direction perpendicular to the first and second directions may be different from a second height of the second selection element layer in the third direction. The first and second variable resistance layers may be made of the same material, and the first and second selection element layers may be made of the same material.

According to example embodiments, a memory device may include a substrate, a plurality of first conductive lines on the substrate, which extend in a first direction parallel to a top surface of the substrate and are spaced apart from each other in a second direction crossing the first direction, a plurality of second conductive lines over the plurality of first conductive lines, which extend in the second direction and are spaced apart from each other in the first direction, a plurality of third conductive lines over the plurality of second conductive lines, which extend in the first direction and being spaced apart from each other in the second direction, a plurality of first memory cells at respective intersections of the plurality of first conductive lines and the plurality of second conductive lines, each of which includes a first selection element layer and a first variable resistance layer which are sequentially stacked in a third direction perpendicular to the first and second directions, and a plurality of second memory cells at respective intersections of the plurality of second conductive lines and the plurality of third conductive lines, each of which includes a second selection element layer and a second variable resistance layer which are sequentially stacked in the third direction. A thickness of the first selection element layer in the third direction may be greater than a thickness of the second selection element layer in the third direction. The first and second variable resistance layers may be made of the same material, and the first and second selection element layers may be made of the same material.

According to example embodiments, a memory device may include a substrate, a first word line layer disposed on the substrate, a common bit line layer disposed on the first word line layer, a second word line layer disposed on the common bit line such that the common bit line layer is vertically between the first word line layer and the second word line layer, a first memory cell layer including a first variable resistance layer and a first ovonic threshold switching layer stacked vertically, the first memory cell layer disposed between the first word line layer and the common bit line layer in a vertical direction, and a second memory cell layer including a second variable resistance layer and a second ovonic threshold switching layer stacked vertically, the second memory cell layer disposed between the second word line layer and the common bit line layer in the vertical direction. The first and second variable resistance layers may be made of the same material, and the first and second ovonic threshold switching layers may be made of the same material. A first thickness of the first ovonic threshold switching layer in the vertical direction may be different from a second thickness of the second ovonic threshold switching layer in the vertical direction.

BRIEF DESCRIPTION OF THE DRAWINGS

Example embodiments of the present disclosure will be more clearly understood from the following detailed description taken in conjunction with the accompanying drawings in which.

DETAILED DESCRIPTION OF THE EMBODIMENTS

The disclosure will now be described more fully hereinafter with reference to the accompanying drawings, in which example embodiments of the inventive concepts are shown. This inventive concepts may, however, be embodied in different forms and should not be construed as limited to the embodiments set forth herein.

Figure 1:
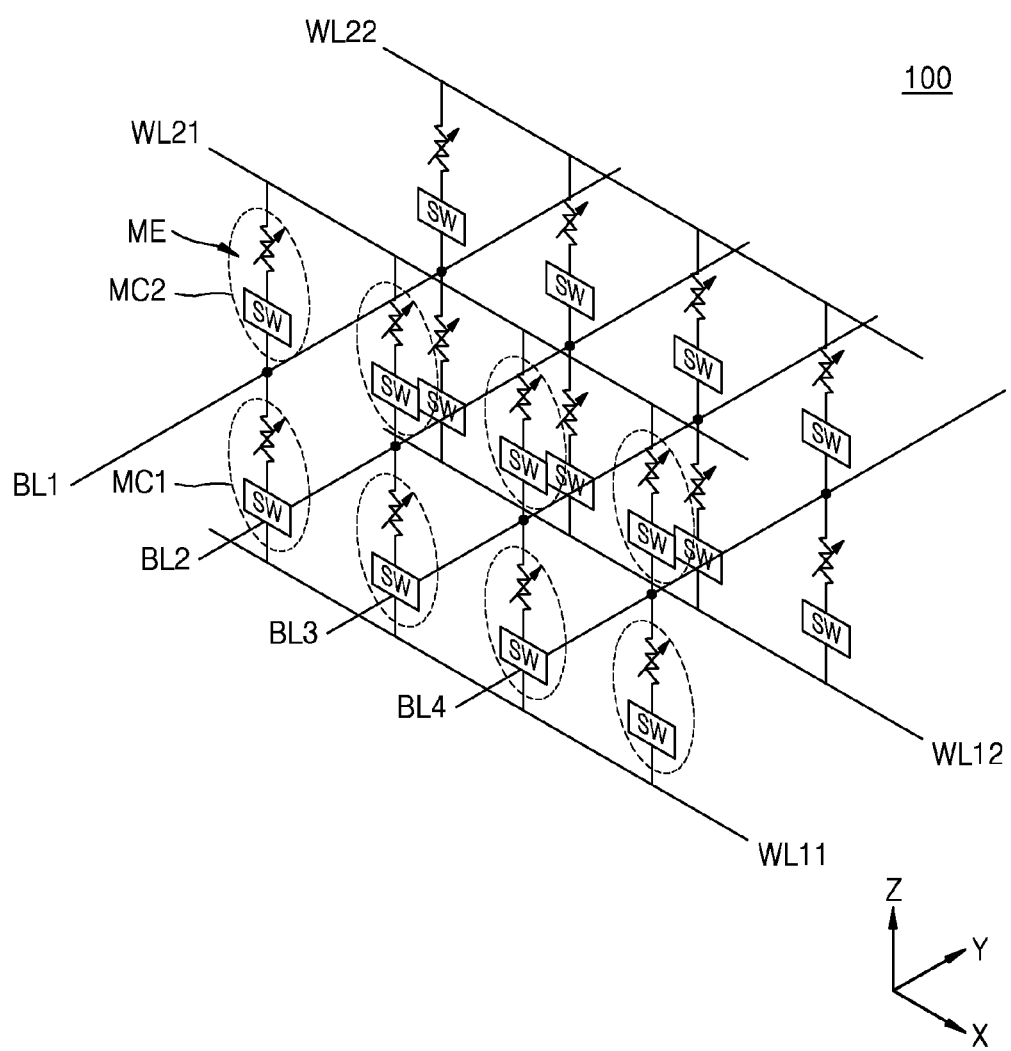
FIG. 1 is an equivalent circuit diagram illustrating a memory device according to example embodiments.

FIG. 1 is an equivalent circuit diagram illustrating a memory device according to example embodiments.

As used herein, a semiconductor device may refer to any of the various devices such as shown in FIGS. 1-3 and 7-15, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, the memory device 100 may include lower word lines WL11 and WL12, upper word lines WL21 and WL22, common bit lines BL1, BL2, BL3, and BL4, first memory cells MC1, and second memory cells MC2. The lower word lines WL11 and WL12 may extend in an X-direction (e.g., referred to as a first direction) and may be spaced apart from each other in a Y-direction (e.g., referred to as a second direction) crossing the first direction. The upper word lines WL21 and WL22 may be spaced apart from the lower word lines WL11 and WL12 in a Z-direction (e.g., referred to as a third direction or a vertical direction) perpendicular to the first and second directions, may extend in the first direction and may be spaced apart from each other in the second direction. The common bit lines BL1, BL2, BL3, and BL4 may be disposed between the lower word lines WL11 and WL12 and the upper word lines WL21 and WL22 to be spaced apart from the lower and upper word lines WL11, WL12, WL21, and WL22 in the third direction.

The common bit lines BL1, BL2, BL3, and BL4 may extend in the second direction and may be spaced apart from each other in the first direction.

The first memory cells MC1 and the second memory cells MC2 may be disposed between the common bit lines BL1, BL2, BL3, and BL4 and the lower word lines WL11 and WL12 and between the common bit lines BL1, BL2, BL3, and BL4 and the upper word lines WL21 and WL22, respectively. More specifically, the first memory cells MC1 may be disposed at respective intersections (or cross-points) of the common bit lines BL1, BL2, BL3, and BL4 and the lower word lines WL11 and WL12 and may each include a variable resistance layer ME for storing information and a selection element SW for selecting a memory cell. The first memory cells MC1 may be arranged in two dimensions in the first and second directions to form a first memory cell layer. The second memory cells MC2 may be disposed at respective intersections (or cross-points) of the common bit lines BL1, BL2, BL3, and BL4 and the upper word lines WL21 and WL22 and may each include a variable resistance layer ME for storing information and a selection element SW for selecting a memory cell. The second memory cells MC2 may be arranged in two dimensions in the first and second directions to form a second memory cell layer. The selection element SW may be referred to as a switching element or an access element.

The first memory cells MC1 and the second memory cells MC2 may be disposed to have the same structure in the third direction. As shown in FIG. 1, in a case where the first memory cell MC1 is between the lower word line WL11 and the common bit line BL1, the variable resistance layer ME may be electrically connected to the common bit line BL1, the selection element SW may be electrically connected to the lower word line WL11, and the variable resistance layer ME may be connected in series with the selection element SW. Further, in a case where the second memory cell MC2 is between the upper word line WL21 and the common bit line BL1, the variable resistance layer ME may be electrically connected to the upper word line WL21, the selection element SW may be electrically connected to the common bit line BL1, and the variable resistance layer ME may be connected in series with the selection element SW. However, aspects of the inventive concepts are not limited thereto. In some embodiments, in each of the first and second memory cells MC1 and MC2, an arrangement of the variable resistance layer ME and the selection element SW may be turned over unlike shown in FIG. 1. For example, the first and second memory cells MC1 and MC2 may be arranged in symmetry in the third direction with respect to the common bit lines BL1, BL1, BL2, BL3, and BL4. For example, in the first memory cells MC1, the variable resistance layers ME may be connected to the lower word lines WL11 and WL12, and the selection elements SW may be connected to the common bit lines BL1, BL1, BL2, BL3, and BL4, and in the second memory cells MC2, the variable resistance layers ME may be connected to the upper word lines WL21 and WL22, and the selection elements SW may be connected to the common bit lines BL1, BL1, BL2, BL3, and BL4, such that each of the first memory cells MC1 and each of the second memory cells MC2 may be arranged in symmetry with respect to a corresponding one of the common bit lines BL1, BL1, BL2, BL3, and BL4.

Hereinafter, an operation method of the memory device 100 will be described.

For example, a voltage may be applied to the variable resistance layer ME of any one of the first memory cells MC1 or the variable resistance layer ME of any one of the second memory cells MC2 through the lower and upper word lines WL11, W12, W21, and W22, and the common bit lines BL1, BL2, BL3, and BL4 to allow for a current to flow in the variable resistance layer ME. The variable resistance layer ME may include, for example, a phase change material capable of reversibly changing between a first state and a second state different from the first state, but not limited thereto. In some embodiments, the variable resistance layer ME may include any kind of a variable resistance material of which a resistance value varies depending on an applied voltage. For example, according to an applied voltage to the variable resistance layer ME of a selected one of the first and second memory cells MC1 and MC2, a resistance value of the variable resistance layer ME may be reversibly varied between the first state and the second state.

According to a resistance change of the variable resistance layer ME, a digital data such as "0" or "1" may be stored in the first and second memory cells MC1 and MC2 and may be erased from the first and second memory cells MC1 and MC2. For example, in the first and second memory cells MC1 and MC2, a high resistance state may be written as data "0" and a low resistance state may be written as data "1". Here, a resistance change operation from the high resistance state ("0" data state) to the low resistance state ("1" data state) may be referred to as a "set" operation and a resistance change operation from the low resistance state ("1" data state) to the high resistance state ("0" data state) may be referred to as a "reset" operation. However, the example embodiments are not limited to the digital data of high resistance state ("0" data state) and the low resistance state ("1" data state). For example, the memory cells MC1 and MC2 may store various resistance states.

By selecting one of the word lines WL11, WL12, WL21, and WL22 and one of the common bit lines BL1, BL2, BL3, and BL4, an arbitrary memory cell among the first and second memory cells MC1 and MC2 may be addressed. By applying a certain signal between the corresponding one of the word lines WL11, WL12, WL21, and WL22 and the corresponding one of the common bit lines BL1, BL2, BL3, and BL4, the corresponding one of the first and second memory cells MC1 and MC2 may be programmed, and by measuring a current value through the corresponding one of the common bit lines BL1, BL2, BL3, and BL4, an information depending on a resistance value of the variable resistance layer ME of the corresponding one of the first and second memory cells MC1 and MC2 may be read.

In example embodiments, a threshold voltage of the selection element SW of the first memory cell MC1 may be substantially the same as a threshold voltage of the selection element SW of the second memory cell MC2. For example, a magnitude difference between the threshold voltage of the selection element SW of the first memory cell MC1 and the threshold voltage of the selection element SW of the second memory cell MC2 may be less than 10% of the threshold voltage of the selection element SW of the first memory cell MC1. For example, the magnitude difference between the threshold voltages of the selection elements SW of the first and second memory cells MC1 and MC2 may be less than 0.5 V. Since the magnitude difference between the threshold voltages of the selection elements SW of the first and second memory cells MC1 and MC2 may be much smaller, a sensing margin in read/write operations may be improved or increased, thereby reducing or preventing a failure of read/write. As a result, the memory device 100 may have an improved reliability.

Figure 2:
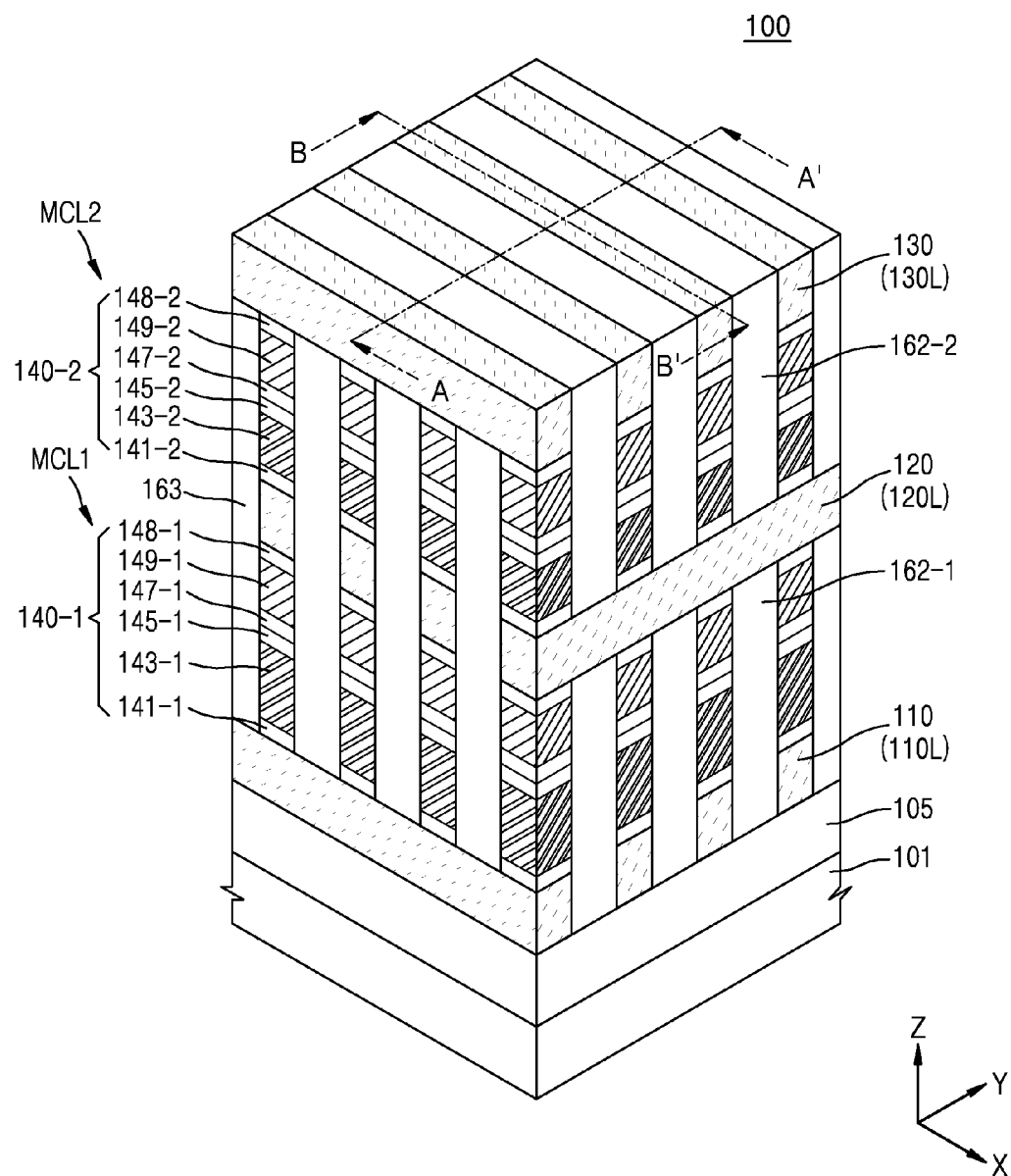
FIG. 2 is a perspective cross-sectional view of a memory device illustrating according to example embodiments.
Figure 3:
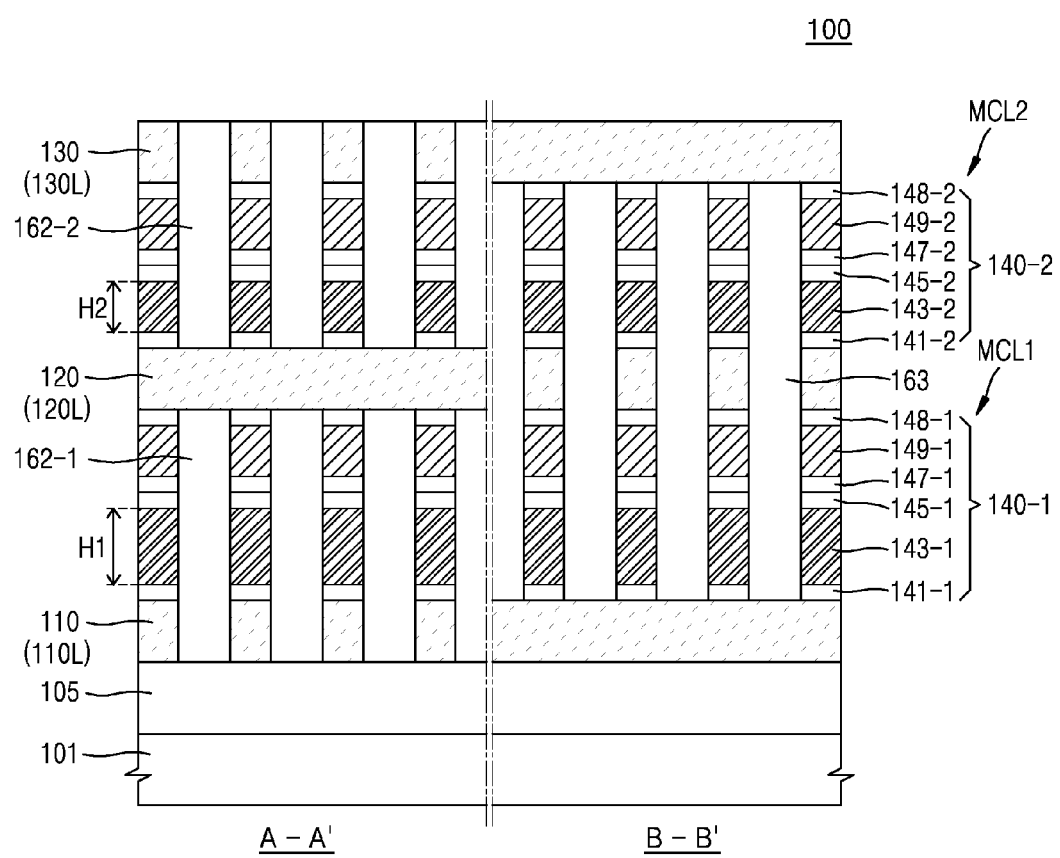
FIG. 3 is a cross-sectional view illustrating cross-sections taken along lines A-A' and B-B' of FIG. 2 according to example embodiments.

FIG. 2 is a perspective cross-sectional view of a memory device illustrating according to example embodiments, and FIG. 3 is a cross-sectional view illustrating cross-sections taken along lines A-A' and B-B' of FIG. 2 according to example embodiments.

Referring to FIGS. 2 and 3, the memory device 100 may include a first conductive line layer 110L, a second conductive line layer 120L, a third conductive line layer 130L, a first memory cell layer MCL1, and a second memory cell layer MCL2, on a substrate 101.

The memory device 100 may further include an interlayer insulating layer 105 disposed on the substrate. The interlayer insulating layer 105 may include oxide such as silicon oxide and nitride such as silicon nitride and may electrically separate the first conductive line layer 110L from the substrate 101.

The first conductive line layer 110L may include a plurality of first conductive lines 110 extending in the first direction (X-direction) and being spaced apart from each other in the second direction (Y-direction). The second conductive line layer 120L may be disposed on the first conductive line layer 110L, may include a plurality of second conducive lines 120 extending in the second direction and being spaced apart from each other in the first direction. The third conductive line layer 130L may be disposed on the second conductive line layer 120L, may include a plurality of third conducive lines 130 extending in the first direction and being spaced apart from each other in the second direction. The plurality of third conductive lines 130 and the plurality of first conductive lines 110 may be positioned at different levels in the third direction (Z-direction) but may have substantially the same arrangement.

In terms of an operation of the memory device, the plurality of first conductive lines 110 and the plurality of third conductive lines 130 may correspond to word lines (e.g., word lines WL11, W12, W21, and WL22 of FIG. 1) and the plurality of second conductive lines 120 may correspond to bit lines (e.g., common bit lines BL1, BL2, BL3, and BL4 of FIG. 1). In some embodiments, the plurality of first conductive lines 110 and the plurality of third conductive lines 130 may correspond to the bit lines (e.g., common bit lines BL1, BL2, BL3, and BL4 of FIG. 1) and the plurality of second conductive lines 120 may correspond to the word lines (e.g., word lines WL11, W12, W21, and WL22 of FIG. 1). In a case where the plurality of first conductive lines 110 and the plurality of third conductive lines 130 correspond to the word lines, the plurality of first conductive lines 110 may correspond to lower word lines (e.g., lower word lines W11 and W12 of FIG. 1) and the plurality of third conductive lines 130 may correspond to upper word lines (e.g., upper word lines W21 and W22 of FIG. 1). Since the plurality of second conductive lines 120 may be commonly shared by the plurality of first conductive lines 110 (i.e., lower word lines) and the plurality of third conductive lines 130 (i.e., upper word lines), the plurality of second conductive lines 120 may be corresponded to common bit lines.

Respective conductive lines of the plurality of first conductive lines 110, the plurality of second conductive lines 120, and the plurality of third conductive lines 130 may include metal, a conductive metal nitride, a conductive metal oxide, or a combination thereof. In example embodiments, respective conductive lines of the plurality first conductive lines 110, the plurality of second conductive lines 120, and the plurality of third conductive lines 130 may include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In one embodiment, respective conductive lines of the plurality first conductive lines 110, the plurality of second conductive lines 120, and the plurality of third conductive lines 130 lines may include a metal layer and a conductive barrier layer to cover at least a portion of the metal layer. The conductive barrier layer may include, for example. Ti, TiN, Ta, TaN, or a combination thereof.

The first memory cell layer MCL1 may include a plurality of first memory cells 140-1 (e.g., first memory cells MC1 of FIG. 1) which are spaced apart from each other in the first and second directions to be arrayed in two-dimensions. The second memory cell layer MCL2 may include a plurality of second memory cells 140-2 (e.g., second memory cells MC2 of FIG. 1) which are spaced apart from each other in the first and second directions to be arrayed in two-dimensions.

As shown in FIG. 2, the plurality of second conductive lines 120 may cross the plurality of first conductive lines 110 and the plurality of third conductive lines 130 may cross the plurality of second conductive lines 120. The first memory cells 140-1 may be disposed between the first conductive line layer 110L and the second conductive line layer 120L and at respective intersections of the plurality of first conductive lines 110 and the plurality of second conducive lines 120. The second memory cells 140-2 may be disposed between the second conductive line layer 120L and the third conductive line layer 130L and at respective intersections of the plurality of second conductive lines 120 and the plurality of third conducive lines 130.

The first memory cells 140-1 and the second memory cells 140-2 may each have a pillar-shaped structure such as a square pillar, but not limited thereto. For example, first memory cells 140-1 and the second memory cells 140-2 may each have various pillar-shapes such as a cylindrical pillar, an oval pillar, or a polygonal pillar. According to a forming method thereof, the first memory cells 140-1 and the second memory cells 140-2 may each have a lower portion lager than an upper portion thereof (e.g., a width of a lower portion greater than a width of an upper portion) or an upper portion lager than a lower portion thereof (e.g., a width of and upper portion greater than a width of a lower portion). In some embodiments, the first memory cells 140-1 and the second memory cells 140-2 may each have substantially vertical sidewalls, thus there is almost no width difference in the lower and upper portions thereof. Although the first memory cells 140-1 and the second memory cells 140-2 are shown as having substantially vertical sidewalls in other drawings in addition to FIGS. 2 and 3, the first memory cells 140-1 and the second memory cells 140-2 may each have a lower portion lager or smaller than an upper portion thereof.

The first memory cells 140-1 may each include a first electrode layer 141-1, a first selection element layer 143-1, a second electrode layer 145-1, a third electrode layer 147-1, a first variable resistance layer 149-1, and a fourth electrode layer 148-1 which are sequentially disposed (or stacked) on the substrate 101. The second memory cells 140-2 may each include a fifth electrode layer 141-2, a second selection element layer 143-2, a sixth electrode layer 145-2, a seventh electrode layer 147-2, a second variable resistance layer 149-2, and an eighth electrode layer 148-2 which are sequentially disposed (or stacked) on the first memory cell layer MCL1 (or the plurality of second conductive lines 120). The first and second memory cells 1401-1 and 140-2 may have substantially the same structure and the same material. Thus, for the sake of brevity, the first memory cells 140-1 will be mainly described hereinafter.

The first variable resistance layer 149-1 (e.g., variable resistance layer ME of FIG. 1) may include a phase change material capable of reversibly changing between the first state and the second state depending on a heating time. For example, the variable resistance layer 149-1 may include a material, of which a phase can be reversibly changed due to joule heat generated by a voltage applied to both terminals of the variable resistance layer 149-1 and a resistance can be changed by the phase change. More specifically, the phase change material may exhibit a high resistance state in an amorphous phase and may exhibit a low resistance state in a crystalline phase. The high resistance state may be defined as "0" state and the low resistance state may be defined as "1" state, and data may be stored in the first variable resistance layer 149-1.

In some embodiments, the first variable resistance layer 149-1 may include one or more elements from VI group of the periodic table (e.g., one or more chalcogen elements) and optionally one or more chemical modifiers from III group, IV group, and/or V group. The first variable resistance layer 149-1 may include Ge—Sb—Te. A chemical composition notation represented by a hyphen (-) used herein represents elements contained in a specific mixture or compound, and serves to represent all chemical structures containing the represented elements. For example, the Ge—Sb—Te material may include $Ge_2Sb_2Te_5$, $Ge_2Sb_2Te_7$, $Ge_1Sb_2Te_4$, or $Ge_1Sb_4Te_7$.

The first variable resistance layer 149-1 may include in variety of phase change materials in addition to the Ge—Sb—Te material. For example, the first variable resistance layer 149-1 may include at least one of Ge—Te, Sb—Te, In—Se, Ga—Sb, In—Sb, As—Te, Al—Te, Bi—Sb—Te (BST), In—Sb—Te(IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, As—Ge—Sb—Te and a combination thereof.

Elements constituting the first variable resistance layer 149-1 may have in a variety of stoichiometric ratios. According to the stoichiometric ratio of the elements, a crystallization temperature, a melting temperature, a phase change rate depending on a crystallization energy, and a data retention characteristic of the first variable resistance layer 149-1 may be controlled.

The first variable resistance layer 149-1 may further include at least one impurity element. The impurity element may include, for example, at least one of carbon (C), nitrogen (N), silicon (Si), bismuth (Bi), and tin (Sn). An operating current of the memory device 100 may be changed by the impurity element. Also, the first variable resistance layer 149-1 may further include a metal. For example, the first variable resistance layer 149-1 may include at least one of aluminium (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pa), hafnium (Hf), tantalum (Ta), iridium (Ir), platinum (Pt), zirconium (Zr), thallium (Tl), lead (Pb), and polonium (Po). The metal may increase an electrical conductivity and a thermal conductivity of the first variable resistance layer 149-1 to increase a crystallization rate thereof, thereby increasing a set programming speed. In addition, the metal may improve a data retention characteristic of the first variable resistance layer 149-1.

The first variable resistance layer 149-1 may include a multi-layered structure in which two or more layers having different physical properties are stacked. The number or thicknesses of the multiple layers constituting the multi-layered structure may not be limited. A barrier layer may be further interposed between the multiple layers constituting the multi-layered structure. The barrier layer may act to prevent diffusion of a material between the multiple layers. When a subsequent layer of the multiple layers is formed, the barrier layer may reduce diffusion of a material contained a preceding layer of the multiple layers.

The first variable resistance layer 149-1 may include a supper-lattice structure constructed of a plurality of layers which include different materials and are alternately stacked on each other. For example, the first variable resistance layer 149-1 may include a stack structure in which a first layer formed of Ge—Te and a second layer formed of Sb—Te are alternately stacked. However, the first layer and the second layer are not limited thereto, and may include various materials described above.

The phase change material as the first variable resistance layer 149-1 may be described above, but aspects of the inventive concepts are not limited thereto. The first variable resistance layer 149-1 of the memory device 100 may include various materials having a resistance change property.

In some embodiments, in a case where the first variable resistance layer 149-1 includes a transition metal oxide, the memory device 100 may be a resistive random access memory (ReRAM) device. In the first variable resistance layer 149-1 including the transition metal oxide, at least one electrical path may be created or vanished by a programming operation. The first variable resistance layer 149-1 may have a low resistance value when the electrical path is created and may have a high resistance value when the electrical path is vanished. By using a difference in the resistance values, the memory device 100 may store data.

In a case where the first variable resistance layer 149-1 includes the transition metal oxide, the transition metal oxide may include at least one of Ta, Zr, Ti, Hf, Mn, Y, Ni, Co, Zn, Nb, Cu, Fe, and Cr. For example, the first variable resistance layer 149-1 including the transition metal oxide may include a single layer or multiple layers, formed of at least one of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above materials, the value x and the value y may be selected in a range of $0 \leq x \leq 1.5$ and $0 \leq y \leq 0.5$, respectively, but not limited thereto.

In other embodiments, in a case where the first variable resistance layer 149-1 includes a magnetic tunnel junction (MTJ) structure including two electrodes formed of a magnetic material and a dielectric layer interposed between the two electrodes, the memory device 100 may be a magnetic random access memory (MRAM) device.

One of the two electrodes may be a magnetization pinned layer, and other of the two electrodes may be a magnetization free layer. The dielectric layer may be a tunnel barrier layer. The magnetization pinned layer may have a pinned magnetization direction, and the magnetization free layer may have a variable magnetization direction parallel or anti-parallel to the pinned magnetization direction of the magnetization pinned layer. The magnetization directions of the magnetization pinned layer and the magnetization free layer may be parallel to a surface of the tunnel barrier layer, but not limited thereto. The magnetization directions of the magnetization pinned layer and the magnetization free layer may be perpendicular to the surface of the tunnel barrier layer.

In a case where the magnetization direction of the magnetization free layer is parallel to the magnetization direction of the magnetization pinned layer, the first variable resistance layer 149-1 may have a first resistance value. Alternatively, in a case where the magnetization direction of the magnetization free layer is anti-parallel to the magnetization direction of the magnetization pinned layer, the first variable resistance layer 149-1 may have a second resistance value. By using a difference between the first and second resistance values, the memory device 100 may store data. The magnetization direction of the magnetization free layer may be varied by spin torques of electrons in a programming current.

The magnetization pinned layer and the magnetization free layer may include a magnetic material. The magnetization pinned layer may further include an anti-ferromagnetic material which fixes a magnetization direction of a ferromagnetic material in the magnetization pinned layer. The tunnel barrier layer may include an oxide including at least one of Mg, Ti, Al, MgZn, and MgB, but not limited thereto.

The first selection element layer 143-1 (e.g., selection element SW of FIG. 1) may act as a current control layer for controlling a current flow. The first selection element layer 143-1 may include a material layer of which a resistance can be varied depending on a voltage applied to both terminals thereof. For example, the first selection element layer 143-1 may include a material layer having an ovonic threshold switching (OTS) property. In a case where the first selection element layer 143-1 includes the material layer having the OTS property, the first selection element layer 143-1 may sustain a high resistance state in which the current hardly flows when a voltage smaller than the threshold voltage of the first selection element layer 143-1 is applied to the first selection element layer 143-1. When a voltage greater than the threshold voltage of the first selection element layer 143-1 is applied to the first selection element layer 143-1, the first selection element layer 143-1 may be in a low resistance state such that the current start flowing. When the current flowing through the first selection element layer 143-1 is less than a holding current, the first selection element layer 143-1 may be switched to the high resistance state. The OTS property of the first selection element layer 143-1 will be described in detail later with reference to FIG. 4, The first selection element layer 143-1 may include a chalcogenide material as OTS material layer. The first selection element layer 143-1 may include one or more elements from VI group of the periodic table (e.g., chalcogen elements) and optionally one or more chemical modifiers from III group, IV group and/or V group. The chalcogen elements contained in the first selection element layer 143-1 may include sulphur (S), selenium (Se), and/or tellurium (Te). The chalcogen elements may be characterized by divalent bonding and the presence of lone pair electrons. The divalent bonding may lead to a formation of chain and ring structures upon combining the chalcogen elements to form chalcogenide materials and the lone pair electrons may provide a source of electrons for forming a conducting filament. Trivalent and tetravalent modifiers such as aluminium (Al), gallium (Ga), indium (In), germanium (Ge), tin (Sn), silicon (Si), phosphorus (P), arsenic (As) and antimony (Sb) may enter the chain and ring structures of chalcogen elements and may affect a structural rigidity of the chalcogenide materials. The structural rigidity of the chalcogenide materials may lead to a classification of the chalcogenide materials into one of threshold switching materials and phase change materials, according to an ability to undergo crystallization or other structural rearrangements.

In some embodiments, the first selection element layer 143-1 may include silicon (Si), tellurium (Te), arsenic (As), germanium (Ge), indium (In), or a combination thereof. For example, the first selection element layer 143-1 may include a silicon (Si) concentration of about 14%, a tellurium (Te) concentration of about 39%, an arsenic (As) centration of about 37%, a germanium (Ge) concentration of about 9%, an indium (In) concentration of about 1%. Here, the percentages are atomic percentages which total 100% of the atoms of the constituent elements.

In some embodiments, the first selection element layer 143-1 may include silicon (Si), tellurium (Te), arsenic (As), germanium (Ge), sulphur (S), selenium (Se) or a combination thereof. For example, the first selection element layer 143-1 may include a silicon (Si) concentration of about 5%, a tellurium (Te) concentration of about 34%, an arsenic (As) centration of about 28%, a germanium (Ge) concentration of about 11%, a sulphur (S) concentration of about 21%, and a selenium (Se) concentration of about 1%.

In some embodiments, the first selection element layer 143-1 may include tellurium (Te), arsenic (As), germanium (Ge), sulphur (S), selenium (Se), antimony (Sb), or a combination thereof. For example, the first selection element layer 143-1 may include a tellurium (Te) concentration of about 21%, an arsenic (As) centration of about 10%, a germanium (Ge) concentration of about 15%, a sulphur (S) concentration of about 2%, a selenium (Se) concentration of about 50%, and an antimony (Sb) concentration of about 2%.

In the memory device 100 according to example embodiments, the first selection element layer 143-1 is not limited to OTS material but includes various materials capable of acting to select a device. For example, the first selection element layer 143-1 may include a diode, a tunnel junction, a bipolar junction transistor, or a mixed ionic-electronic conduction switch (MIEC).

The first electrode layer 141-1, the second electrode layer 145-1, the third electrode layer 147-1, and the fourth electrode layer 148-1 may act as an electrical path and may be formed of a conductive material. The first through fourth electrode layers 141-1, 145-1, 147-1 and 148-1 may include a metal, a conductive metal nitride, a conductive metal oxide, or a combination thereof. For example, each of the first through fourth electrode layers 141-1, 145-1, 147-1 and 148-1 may include a TiN layer, but not limited thereto. In some embodiments, each of the first through fourth electrode layers 141-1, 145-1, 147-1 and 148-1 may include a conductive layer formed of a metal or a conductive metal nitride and at least one conductive barrier layer covering at least a portion of the conductive layer. The conductive barrier layer may include a metal oxide, a metal nitride, or a combination thereof, but not limited thereto.

In some embodiments, the third electrode layer 147-1 and/or the fourth electrode layer 148-1 which contact the first variable resistance layer 149-1 may include a conductive material capable of generating heat enough to change a phase of the first variable resistance layer 149-1. For example, the third electrode layer 147-1 or the fourth electrode layer 148-1 may include a refractory metal, a refractory metal nitride, and/or a carbon-based conductive material. The third electrode layer 147-1 or the fourth electrode layer 148-1 may include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof. However, the third electrode layer 147-1 or the fourth electrode layer 148-1 is not limited thereto.

In some embodiments, a heating electrode layer may further be interposed between the first variable resistance layer 149-1 and the third electrode layer 147-1 or between the first variable resistance layer 149-1 and the fourth electrode layer 148-1. The heating electrode layer may include a conductive material capable of generating heat enough to change the phase of the variable resistance layer 149-1. For example, the heating electrode layer may include a refractory metal, a refractory metal nitride, or a carbon-based conductive material. The heating electrode layer may include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof, but not limited thereto.

Although the first variable resistance layer 149-1 is shown as disposed on the first selection element layer 143-1 with the second electrode layer 145-1 and the third electrode layer 147-1 interposed therebetween in FIGS. 2 and 3, aspects of the inventive concepts are not limited thereto. Unlike shown in FIGS. 2 and 3, the first selection element layer 143-1 is disposed on the first variable resistance layer 149-1 with the second electrode layer 145-1 and the third electrode layer 147-1 interposed therebetween, and the first variable resistance layer 149-1 may be interposed between the first electrode layer 141-1 and second electrode layer 145-1. For example, the first electrode layer 141-1 and/or the second electrode layer 145-1 which contact the first variable resistance layer 149-1 may include a conductive material capable of generating heat enough to change the phase of the first variable resistance layer 149-1. Also, a heating electrode layer may further be interposed between the first variable resistance layer 149-1 and the first electrode layer 141-1 and between the first variable resistance layer 149-1 and the second electrode layer 145-1.

The first electrode layer 141-1 and the fourth electrode layer 148-1 may be optionally formed. For example, the first electrode layer 141-1 and the fourth electrode layer 148-1 may be omitted. However, at least one of the first electrode layer 141-1 and the fourth electrode layer 148-1 may be respectively disposed between one of the first and second conductive lines 110 and 120 and the first selection element layer 143-1 and/or between one of the first and second conductive lines 110 and 120 and the first variable resistance layer 149-1 so as to prevent a contamination or a contact failure generated due to a direct contact between one of the first and second conductive lines 110 and 120 and the first selection element layer 143-1 and/or between one of the first and second conductive lines 110 and 120 and the first variable resistance layer 149-1.

At least one of the second electrode layer 145-1 and the third electrode layer 147-1 may be necessarily disposed between the first selection element layer 143-1 and the first variable resistance layer 149-1. When the first selection element layer 143-1 is based on the OTS property, the first selection element layer 143-1 may include a chalcogenide material in an amorphous state. According to a tendency to downscale the memory device 100, in the variable resistance layer 149-1, the selection element layer 143-1, the second electrode layer 145-1, and the third electrode layer 147-1, a thickness thereof, a width thereof, and a distance therebetween may be reduced. Thus, on the operation of the memory device 100, the heating electrode layer (or the third electrode layer 147-1 when the further heating electrode layer is not formed) may be heated to lead to the phase change of the first variable resistance layer 149-1, such that the neighbouring first selection element layer 143-1 may be affected by the heat. For example, the first selection element layer 143-1 may be partially crystallized by the heat from the neighbouring first variable resistance layer 149-1, thereby causing degradation or damage in the first selection element layer 143-1. Therefore, at least one of the second electrode layer 145-1 and the third electrode layer 147-1 may be necessarily disposed between the first selection element layer 143-1 and the first variable resistance layer 149-1 to prevent or reduce the degradation or damage in the first selection element layer 143-1.

The first through fourth electrode layers 141-1. 145-1, 147-1 and 148-1 may be formed of various materials. According to an arrangement of the heating electrode layer, the first through fourth electrode layers 141-1. 145-1, 147-1 and 148-1 may respectively have a varying thickness. For example, in a case where the heating electrode layer is interposed between the third electrode layer 147-1 and the variable resistance layer 149-1, the third electrode layer 147-1 and the second electrode layer 145-1 may be formed to be thick enough to prevent the heat of the heating electrode layer from being transmitted to the first selection element layer 143-1. When the heating electrode is not formed and the third electrode layer 147-1 is formed of a conductive material capable of generating heat enough to change the phase of the first variable resistance layer 149-1, the second electrode layer 145-1 may be formed to be thick enough to prevent the heat of the third electrode layer 147-1 from being transmitted to the first selection element layer 143-1. For example, the second electrode layer 145-1 and the third electrode layer 147-1 may have a thickness of 10 nm to 100 nm, but not limited thereto. Further, each of the second electrode layer 145-1 and the third electrode layer 147-1 may have at least one thermal barrier layer acting to block the heat. In a case where each of the second electrode layer 145-1 and the third electrode layer 147-1 has two or more thermal barrier layers, each of the second electrode layer 145-1 and the third electrode layer 147-1 may have a stack structure in which the thermal barrier layer and the electrode material layer are alternately stacked.

A first insulating layer 162-1 may be disposed between the plurality of first conductive lines 110. The first insulating layer 162-1 and a third insulating layer 163 may be disposed between the first memory cells 140-1 of the first memory cell layer MCL1. For example, the first insulating layer 162-1 may be disposed between the first memory cells 140-1 arranged in the second direction (Y-direction) and the third insulating layer 163 may be disposed between the first memory cells 140-1 arranged in the first direction (X-direction). The third insulating layer 163 may be disposed between the second conductive lines 120 arranged in the first direction. A second insulating layer 162-2 may be disposed between the second memory cells 140-2 of the second memory cell layer MCL2 which are arranged in the second direction and may be disposed between the third conductive lines 130 arranged in the second direction. The first through third insulating layers 162-1, 162-2, and 163 may be formed of the same insulating material, or at least one of the first through third insulating layers 162-1, 162-2, and 163 may be formed of a different material from the other of the first through third insulating layers 162-1, 162-2, and 163. Each of the first through third insulating layers 162-1, 162-2, and 163 may be formed of oxide or nitride and may separate electrically the memory cells (or the elements) of each memory cell layer from each other. In some embodiments, at least one of the first through third insulating layers 162-1, 162-2, and 163 may be replaced by an air space. For example, at least one of the first through third insulating layers 162-1, 162-2, and 163 may not be formed, thereby forming the air space between the first memory cells 140-1 and between the second memory cells 140-2. In a case where the air space is formed, an insulating liner with a certain thickness may be disposed between the air space and at least one of the first and second memory cells 140-1 and 140-2.

As illustrated in FIG. 3, the first selection element layer 143-1 of the first memory cell 140-1 may have a first height (or thickness) H1 in the third direction (Z-direction of FIG. 2), and the second selection element layer 143-2 of the second memory cell 140-2 may have a second height (or thickness) H2 less than the first height H1 in the third direction. In some embodiments, the first height H1 of the first selection element layer 143-1 of the first memory cell 140-1 may range from 10 nm to 500 nm, and the second height H2 of the second selection element layer 143-2 of the second memory cell 140-2 may range from 5 nm to 450 nm, but not limited thereto.

In some embodiments, the second height H2 of the second selection element layer 143-2 may range from, for example, 50% to 90% of the first height H1 of the first selection element layer 143-1, but not limited thereto.

The first height H1 of the first selection element layer 143-1 and the second height H2 of the second selection element layer 143-2 may be controlled so that a magnitude of a first threshold voltage $V_{T1}$ of the first selection element layer 143-1 and a magnitude of a second threshold voltage $V_{T2}$ of the second selection element layer 143-2 are substantially the same.

In some embodiments, the first height H1 of the first selection element layer 143-1 and the second height H2 of the second selection element layer 143-2 may be controlled so that a magnitude difference between the first threshold voltage $V_{T1}$ of the first selection element layer 143-1 and the second threshold voltage $V_{T2}$ of the second selection element layer 143-2 is less than 0.5 V. For example, the magnitude of the second threshold voltage $V_{T2}$ of the second selection element layer 143-2 may be smaller or greater than the magnitude of the first threshold voltage $V_{T1}$ of the first selection element layer 143-1 by less than 0.5 V.

In some embodiments, the first height H1 of the first selection element layer 143-1 and the second height H2 of the second selection element layer 143-2 may be controlled so that the magnitude of the second threshold voltage $V_{T2}$ of the second selection element layer 143-2 ranges from, for example, 80% to 120% of the magnitude of the first threshold voltage $V_{T1}$ of the first selection element 143-1. The magnitude of a second threshold voltage $V_{T2}$ of the second selection element layer 143-2 may range from, for example, 90% to 110% of the magnitude of the first threshold voltage $V_{T1}$ of the first selection element 143-1.

In a case where the magnitude of a second threshold voltage $V_{T2}$ of the second selection element layer 143-2 ranges from 80% to 120% of the magnitude of the first threshold voltage $V_{T1}$ of the first selection element layer 143-1, a difference in electrical properties of the first memory cell MC1 and the second memory cell MC2 may be reduced, thereby increasing a sensing margin for the read/write operations of the memory device 100.

Hereinafter, a relationship between a threshold voltage and an electrical property of the selection element layers 143-1 and 143-2 having the ovonic threshold switching (OTS) property will be described in detail with reference to FIGS. 4 through 6.

Figure 4:
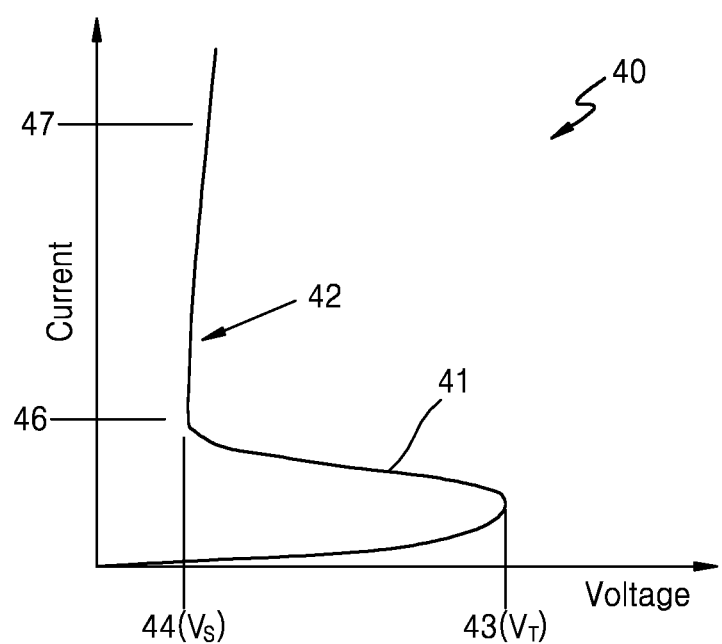
FIG. 4 is a schematic graph illustrating a voltage-current curve of an ovonic threshold switching (OTS) element representing an OTS property.

FIG. 4 is a schematic graph illustrating a voltage-current curve 40 of an ovonic threshold switching (OTS) element representing an OTS property. FIG. 4 illustrates schematically the current flowing through the OTS element in response to a voltage applied to both terminals of the OTS element.

Referring to FIG. 4, a first curve 41 may represent a voltage-current relationship in a state in which the current does not flow through the OTS element. The OTS element here may function as a switching element having a threshold voltage $V_T$ at a first voltage level 43. When the voltage is gradually increased from a state in which the current and the voltage are at zero, the current may hardly flow through the OTS element until the voltage reaches at the threshold voltage $V_T$ (i.e., a first voltage level 43). However, as soon as the voltage exceeds the threshold voltage $V_T$, the current flowing through the OTS element may be drastically increased and the voltage applied across the OTS element may be decreased up to a second voltage level 44 (or a saturation voltage Vs).

A second curve 42 may represent the voltage-current relationship in a state in which the current flows through the OTS element. As the current flowing through the OTS element is increased more than a first current level 46, the voltage applied across the OTS element may be increased a little more than the second voltage level 44. For example, while the current flowing through the OTS element is significantly increased from the first current level 46 to a second current level 47, the voltage applied across the OTS element may be slightly increased from the second voltage level 44. For example, once the current flows through the OTS element, the voltage applied across the OTS element may be sustained almost at the saturation voltage Vs (i.e., second voltage level 44). When the current is decreased to less than the sustaining current level (i.e., less than first current level 46), the OTS element may be switched back to the resistance state, thereby blocking effectively the current until the voltage is increased up to the threshold voltage $V_T$.

Figure 5A:
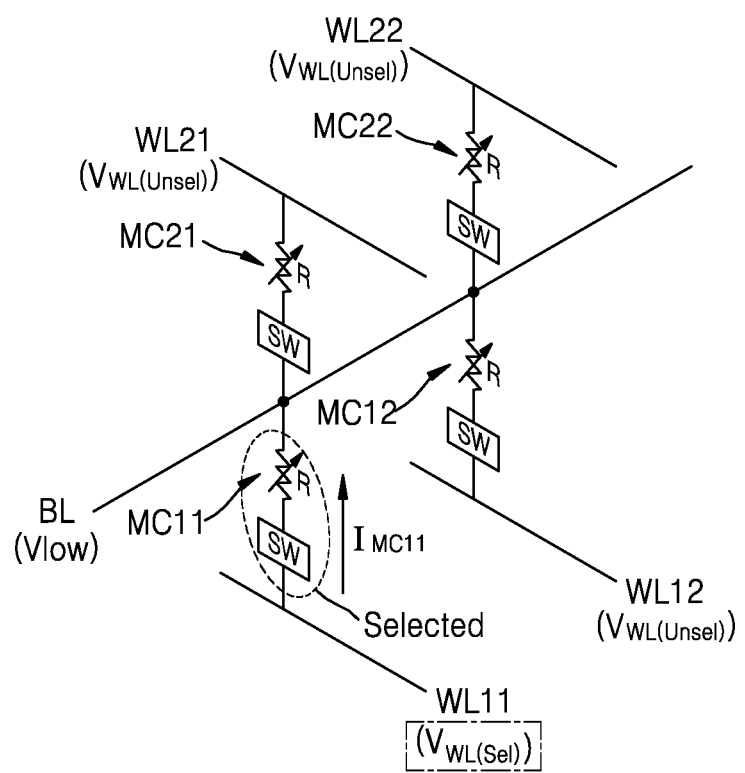
FIGS. 5A and 5B are schematic views illustrating an operation method of a memory device having a stacked cross-point structure according to example embodiments.
Figure 5B:
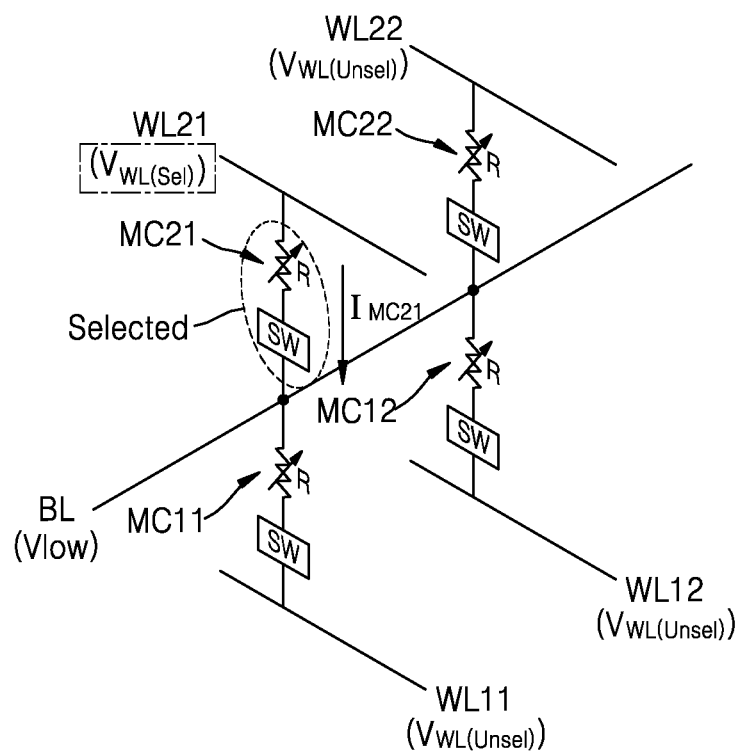

FIGS. 5A and 5B are schematic views illustrating an operation method of a memory device having a stacked cross-point structure according to example embodiments.

FIGS. 5A and 5B illustrate a read operation or a write operation of the memory device having the stacked cross-point structure in which first and second lower memory cells MC11 and MC12 and first and second upper memory cells MC21 and MC22 may be disposed between common bit lines BL and first and second lower word lines WL11 and WL12 under the common bit lines BL and between the common bit lines BL and first and second upper word lines WL21 and WL22 over the common bit lines BL, respectively.

Referring to FIG. 5A, the first lower memory cell MC11 at an intersection of the first lower word line WL11 and the common bit line BL may be selected. To select the first lower word line WL11, a lower voltage Vlow (e.g., bit line selection voltage or inhibit voltage) may be applied to the common bit line BL and a word line selection voltage $V_{WL(Sel)}$ may be applied to the first lower word line WL11.

For example, the write operation may be carried out to store data in the first lower memory cell MC11 (e.g., the write operation may be carried out by the reset operation and set operation), and the read operation may be carried out to read the stored data in the first lower memory cell MC11. The word line selection voltage $V_{WL(Sel)}$ having relatively a higher value may be applied to the selected first lower word line WL11 and a lower voltage Vlow having relatively a lower value may be applied to the common bit line BL, thus a first switching voltage having a difference value ($V_{WL(Sel)}$-Vlow) may be applied across the first lower memory cell MC11. A magnitude of the first switching voltage may be greater than that of the threshold voltage of the selection element SW having the OTS property. Thus, the selection element SW of the first lower memory cell MC11 may be turned-on such that a first current $I_{MC11}$ flows through a variable resistance layer R of the first lower memory cell MC11. In one embodiment, a magnitude of the first current $I_{MC11}$ is variable based on a resistance state (e.g., set or reset) of the variable resistance layer R of the first lower memory cell MC11.

Meanwhile, a word line unselection voltage $V_{WL(Unsel)}$ may be applied to the second lower word line WL12 and the first and second upper word lines WL21 and WL22 which are unselected. Thus, an off voltage having a difference value ($V_{WL(Unsel)}$-Vlow) may be applied across the unselected memory cells MC12, MC21, and MC22. A magnitude of the off voltage may be smaller than that of the threshold voltage of the selection element SW having the OTS property, thus the selection element SW may not be turned on. As a result, the current may not flow through the variable resistance layers R of the unselected memory cells MC12, MC21, and MC22.

Referring to FIG. 5B, the first upper memory cell MC21 at intersection of the first upper word line WL 21 and the common bit line BL may be selected. To select the first upper memory cell MC21, the lower voltage Vlow may be applied to the common bit line BL and the word line selection voltage $V_{WL(Sel)}$ may be applied to the first upper word line WL21. Thus, a second switching voltage having a difference voltage ($V_{WL(Sel)}$-Vlow) may be applied across the first upper memory cell MC21. A magnitude of the second switching voltage may be greater than the threshold voltage of the selection element SW having the OTS property. Thus, the selection element SW of the first upper memory cell MC21 may be turned on such that a second current $I_{MC21}$ flows through the variable resistance R of the first upper memory cell MC21.

When compared to FIG. 5A and FIG. 5B, the magnitude of the first switching voltage applied across the selected first lower memory cell MC11 may be equal to that of the second switching voltage applied across the selected first upper memory cell MC21. However, a direction of the first current $I_{MC11}$ flowing through the first lower memory cell MC11 may be different from that of the second current $I_{MC11}$ flowing through the first upper memory cell MC21. Thus, an amount of the first current $I_{MC11}$ flowing through the first lower memory cell MC11 may be different from that of the second current $I_{MC21}$ flowing through the first upper memory cell MC21.

For example, the relatively high voltage may be applied to the first lower word line WL11 in relation to the selection element SW of the first lower memory cell MC11, and the relatively high voltage may be applied to the first upper word line WL21 in relation to the selection element SW of the first upper memory cell MC21. Therefore, the selection element SW of the first lower memory cell MC11 and the selection element SW of the first upper memory cell MC21 may respectively be subjected to an electric field in different directions. An influence or effect by the electric fields in the different directions will be described with reference to FIG. 6.

Figure 6:
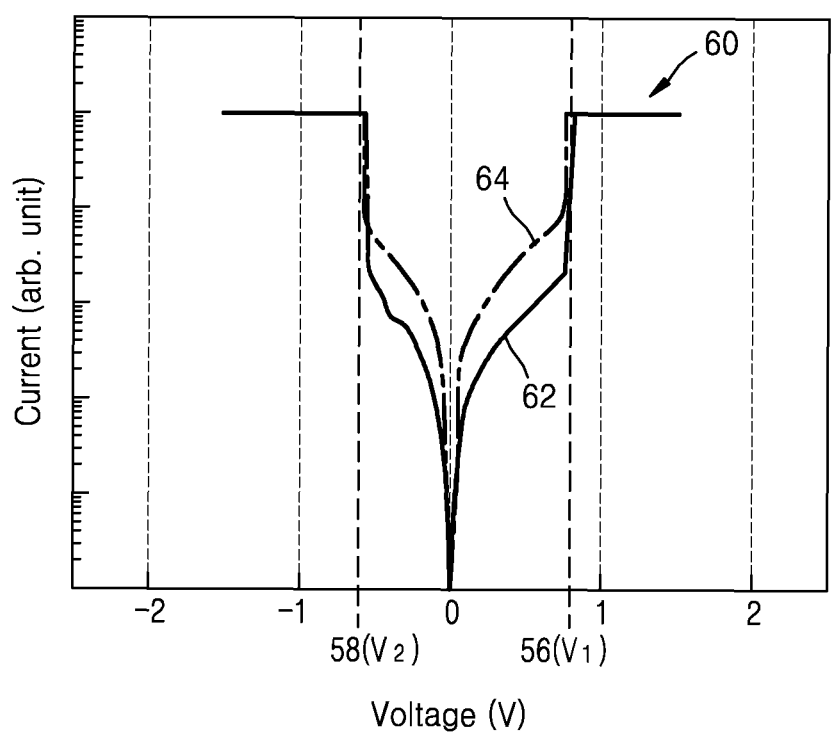
FIG. 6 illustrates a voltage-current graph on applying respectively a positive voltage and a negative voltage to an OTS element.

FIG. 6 illustrates a voltage-current graph 60 on applying respectively a positive voltage and a negative voltage to an OTS element.

Referring to FIG. 6, in the OTS element of a first experimental example 62 and the OTS element of a second experimental example 64 which are having different dimensions, it is founded that different voltage-current profiles are obtained when the positive voltage and the negative voltage are applied. More specifically, the OTS element of the first experimental example 62 has a first threshold voltage 56 ($V_1$) in a period of the positive voltage and a second threshold voltage 58 ($V_2$) in a period of the negative voltage. It is explicitly founded that a magnitude of the first threshold voltage 56 ($V_1$) is greater than that of the second threshold voltage 58 ($V_2$).

For example, the current flowing through the selection element SW and the threshold voltage of the selection element SW may be varied depending on the direction of the electrical field acting on the selection element SW. In FIGS. 5A and 5B, even if the selection voltage $V_{WL(Sel)}$ of the same magnitude is applied to the first lower word line WL11 and the first upper word line WL21, the first lower memory cell MC11 connected to the first lower word line WL11 and the first upper memory cell MC21 connected to the first upper word line WL21 may have different current profiles and different threshold voltages from each other.

This phenomenon may be understood as resulting from an asymmetric defect density and composition distribution in a selection element SW. For example, the selection element SW having the OTS property may include the chalcogenide material. In a switching mechanism of the chalcogenide material, when a high electrical filed is applied to the chalcogenide material, it is known that electron trap sites in the chalcogenide material are unevenly distributed such that electrons move at a relatively high speed along the electron trap sites.

Also, in a case where a large number of defects in the selection element layer SW are generated, a density of the electron trap sites may be increased. Thus, in even a small electrical field, the electrons may move along the electron trap sites such that the threshold voltage of the selection element SW becomes reduced.

Referring again to FIGS. 2 and 3, the first height H1 of the first selection element layer 143-1 of the first memory cell 140-1 may be greater than the second height H2 of the second selection element layer 143-2 of the second memory cell 140-2. Such a structure may be formed as a result that, in consideration of a defect density in the first and second selection element layers 143-1 and 143-2, the first and second height H1 and H2 are controlled such that the magnitude of the threshold voltage of the first selection element layer 143-1 is substantially equal to that of the second selection element layer 143-2.

The first selection element layer 143-1 which is positioned at a first level over the substrate 101 may have a different defect density than that of the second selection element layer 143-2 which is positioned at a second level over the substrate 101. Here, the second level means a position that is further away from the substrate 101 in the third direction (Z-direction) than the first level. For example, it means that the first selection element layer 143-1 is closer to a top surface of the substrate 101 than the second selection element layer 143-2.

The first selection element layer 143-1 at the first level may be exposed to process environments such as a deposition process of forming following layers and/or an etching process, for a long time compared to the second selection element layer 143-2 at the second level. In such process environments, heat may be supplied from a chuck under the substrate 101 or a heater to maintain a processing temperature ranging from several tens of degrees centigrade to several hundreds of degrees centigrade. Thus, the first selection element layer 143-1 at the first level may be exposed to a deposition environments and/or an etching environments under a high temperature atmosphere for a long time compared to the second selection element layer 143-2 at the second level. As a result, the first selection element layer 143-1 may be easily damaged due to the long-time exposure to the deposition environments and/or the etching environments compared to the second selection element layer 143-2 such that the first selection element layer 143-1 at the first level may have the defect density greater than that of the second selection element layer 143-2 at the second level.

As described above, according to the switching mechanism of the selection element layers 143-1 and 143-2, in a case where the first selection element layer 143-1 has the defect density greater than the second first selection element layer 143-2, the threshold voltage of the first selection element layer 143-1 at the first level may be smaller in magnitude than that of the second selection element layer 143-2 at the second level. A difference in magnitude between the threshold voltage of the first selection element layer 143-1 and the threshold voltage of the second selection element layer 143-2 may cause a less sensing margin in the write operation and/or the read operation, thereby inducing a failure in the write operation and/or the read operation of the memory device 100.

According to the example embodiments as described above, the first height H1 of the first selection element layer 143-1 of the first memory cell 140-1 and the second height H2 of the second selection element layer 143-2 of the second memory cell 140-2 may be controlled so that the magnitude of the threshold voltage of the first selection element layer 143-1 and the magnitude of the threshold voltage of the second selection element layer 143-2 are substantially the same.

For example, since the first height H1 of the first selection element layer 143-1 of the first memory cell 140-1 is greater than the second height H2 of the second selection element layer 143-2 of the second memory cell 140-2, even if the switching voltage applied to the first and second selection element layers 143-1 and 143-2 is the same, the magnitude of the electric field acting on the first selection element layer 143-1 may be smaller than that acting on second selection element layer 143-2. Thus, in a case where the first selection element layer 143-1 includes a greater defect density, a reduction of the threshold voltage of the first selection element layer 143-1 due to the defects may be prevented and a difference in the threshold voltages of the first and second selection element layers 143-1 and 143-2 may be reduced.

Also, a presence of the difference in the first height H1 of the first selection element layer 143-1 and the second height H2 of the second selection element layer 143-2 may be a result that the first height H1 and the second height H2 are controlled in consideration of a direction of the electric field applied to the first and second selection element layers 143-1 and 143-2 so that the threshold voltage of the first selection element layer 143-1 and the threshold voltage of the second selection element layer 143-2 are substantially the same.

As described with reference to FIGS. 5A, 5B and 6, when the negative voltage is applied to the first and second selection element layers 143-1 and 143-2, it is founded that the first and second selection element layers 143-1 and 143-2 have a lower threshold voltage than when the positive voltage is applied to the first and second selection element layers 143-1 and 143-2. Thus, in a general case where the first selection element layer 143-1 and the second selection element layer 143-2 have the same height, when the negative voltage is applied to the first selection element layer 143-1 and the positive voltage is applied to the second selection element layer 143-2, the threshold voltage (e.g., 58 (V$_2$) of FIG. 6) of the first selection element layer 143-1 may be smaller in magnitude than the threshold voltage (e.g., 56 (V$_1$) of FIG. 6) of the second selection element layer 143-2. For example, when the relatively lower voltage is applied to the second conductive line 120 (e.g., the common bit line BL) and the relatively higher voltage is applied to the first conductive line 110 (e.g., the first lower word line WL11) and the third conductive line 130 (e.g., the first upper word line WL21) (i.e., when the inhibit voltage is applied to the second conductive line 120 and the word line selection voltage that is greater than the inhibit voltage is applied to the first and third conductive lines 110 and 130), the threshold voltage (e.g., 58 (V$_2$) of FIG. 6) of the first selection element layer 143-1 may be smaller in magnitude than the threshold voltage (e.g., 56 (V$_1$) of FIG. 6) of the second selection element layer 143-2.

According to the example embodiments as described above, since the first height H1 of the first selection element layer 143-1 is greater than the second height H2 of the second selection element layer 143-2, when the negative voltage is applied to the first selection element layer 143-1 and the positive voltage is applied to the second selection element layer 143-2, the electric field acting on the first selection element layer 143-1 may be smaller in magnitude than that acting on the second selection element layer 143-2. Thus, a magnitude difference in the threshold voltages of the first and second selection element layers 143-1 and 143-2 may be reduced and a difference in electrical properties of the first and second memory cells 140-1 and 140-2 may be reduced.

As a result, since the magnitude difference in the threshold voltages of the first and second selection element layers 143-1 and 143-2 is reduced, the sensing margin in the write operation and/or the read operation of the memory device 100 may be increased and the failure of the write operation and/or the read operation of the memory device 100 due to the reduced sensing margin may be prevented or reduced. Thus, a reliability of the memory device 100 may be improved.

FIGS. 7 to 13 are cross-sectional views illustrating memory devices 100A, 100B, 100C, 100D, 100E, 100F, and 100G according to example embodiments, respectively and illustrate cross-sections taken along line A-A' and B-B' of FIG. 2. In the embodiments in connection with FIGS. 7 to 13, the same elements as described in the embodiments of FIGS. 1 to 6 will be indicated by the same reference numerals or the same reference designators.

Figure 7:
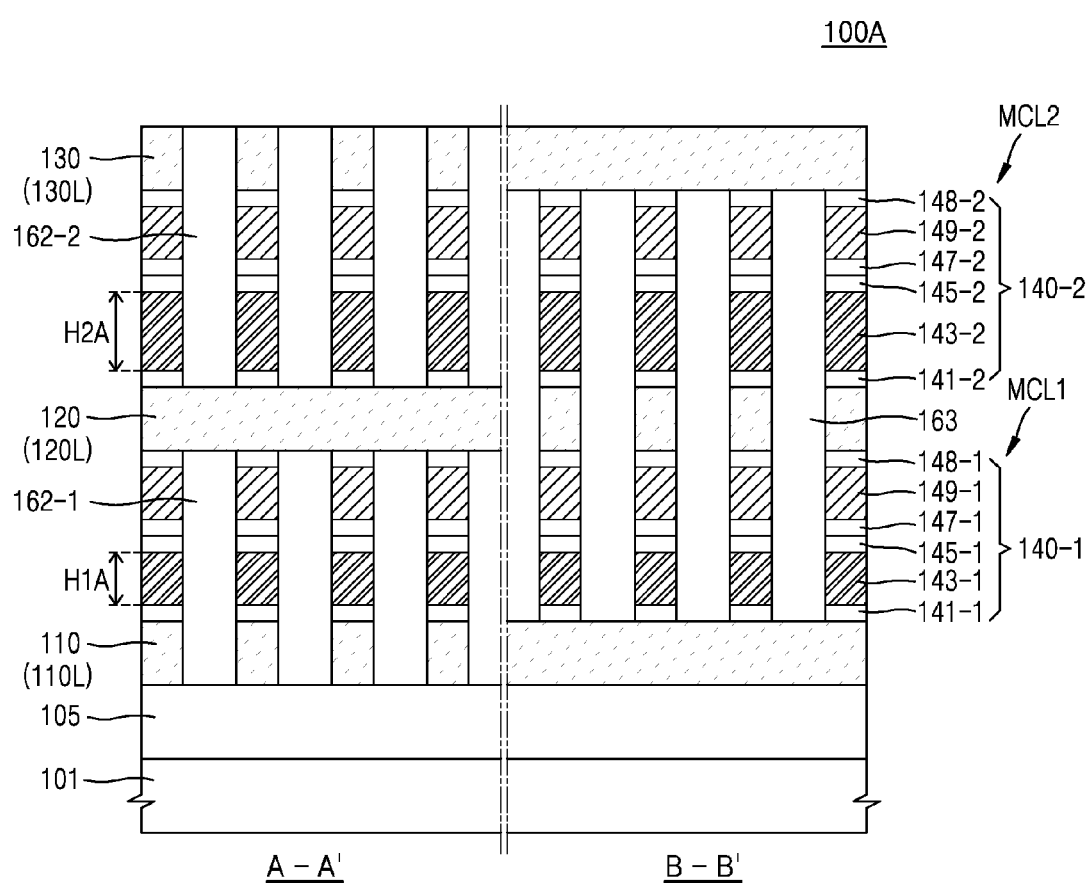
FIGS. 7 through 13 are cross-sectional views illustrating a memory device according to example embodiments, respectively.

Referring to FIG. 7, in the memory device 100A according to an example embodiment, the first height H1A of the first selection element layer 143-1 of the first memory cell 140-1 is smaller than the second height H2A of the second selection element layer 143-2 of the second memory cell 140-2. The first height H1A of the first selection element layer 143-1 and the second height H2A of the second selection element layer 143-2 may be controlled so that the magnitude of the first threshold voltage V$_{T1}$ of the first selection element layer 143-1 and the magnitude of the second threshold V$_{T2}$ of the second selection element layer 143-2 are substantially the same. For example, the magnitude of the second threshold V$_{T2}$ of the second selection element layer 143-2 may range from, for example, 80% to 120%, preferably 90% to 110%, of the magnitude of the first threshold voltage V$_{T1}$ of the first selection element layer 143-1.

In some embodiments, the first height H1A of the first selection element layer 143-1 and the second height H2A of the second selection element layer 143-2 may be controlled so that a difference in the magnitude between the first threshold voltage V$_{T1}$ of the first selection element layer 143-1 and the second threshold V$_{T2}$ of the second selection element layer 143-2 is in a range of less than 0.5 V.

In some embodiments, the first height H1A of the first selection element layer 143-1 may range from, for example, 5 nm to 450 nm, and the second height H2A of the second selection element layer 143-2 may be, for example, 10 nm to 500 nm, but not limited thereto. For example, the first height H1A of the first selection element layer 143-1 may range from 50% to 90% of the second height H2A of the second selection element layer 143-2, but not limited thereto.

As described with reference with FIGS. 5A, 5B and 6, when the negative voltage is applied to the first and second selection element layers 143-1 and 143-2, it is founded that the first and second selection element layers 143-1 and 143-2 have the threshold voltage lower than when the positive voltage is applied to the first and second selection element layers 143-1 and 143-2. Thus, in a general case where the first selection element layer 143-1 and the second selection element layer 143-2 have the same height, when the positive voltage is applied to the first selection element layer 143-1 and the negative voltage is applied to the second selection element layer 143-2, in consideration of a direction of the electric field, the threshold voltage of the second selection element layer 143-2 may be smaller in magnitude than the threshold voltage of the first selection element layer 143-1. For example, when the relatively higher voltage is applied to the second conductive line 120 (e.g., the common bit line BL) and the relatively lower voltage is applied to the first conductive line 110 (e.g., the first lower word line WL11) and the third conductive line 130 (e.g., the first upper word line WL21) (i.e., when the inhibit voltage is applied to the second conductive line 120 and the word line selection voltage that is smaller than the inhibit voltage is applied to the first and third conductive lines 110 and 130), the threshold voltage of the second selection element layer 143-2 may be smaller in magnitude than the threshold voltage of the first selection element layer 143-1.

According to the example embodiments, since the second height H2A of the second selection element layer 143-2 is greater than the first height H1A of the first selection element layer 143-1, when the positive voltage is applied to the first selection element layer 143-1 and the negative voltage is applied to the second selection element layer 143-2, the electric field acting on the second selection element layer 143-2 may be smaller in magnitude than that acting on the first selection element layer 143-1. For example, a magnitude difference in the threshold voltages of the first and second selection element layers 143-1 and 143-2 may be reduced and a difference in electrical properties of the first and second memory cells 140-1 and 140-2 may be reduced.

As a result, since the magnitude difference in the threshold voltages of the first and second selection element layers 143-1 and 143-2 is reduced, the sensing margin in the write operation and/or the read operation of the memory device 100A may be increased and the failure of the write operation and/or the read operation of the memory device 100A due to the reduced sensing margin may be prevented or reduced. Thus, a reliability of the memory device 100A may be improved.

Figure 8:
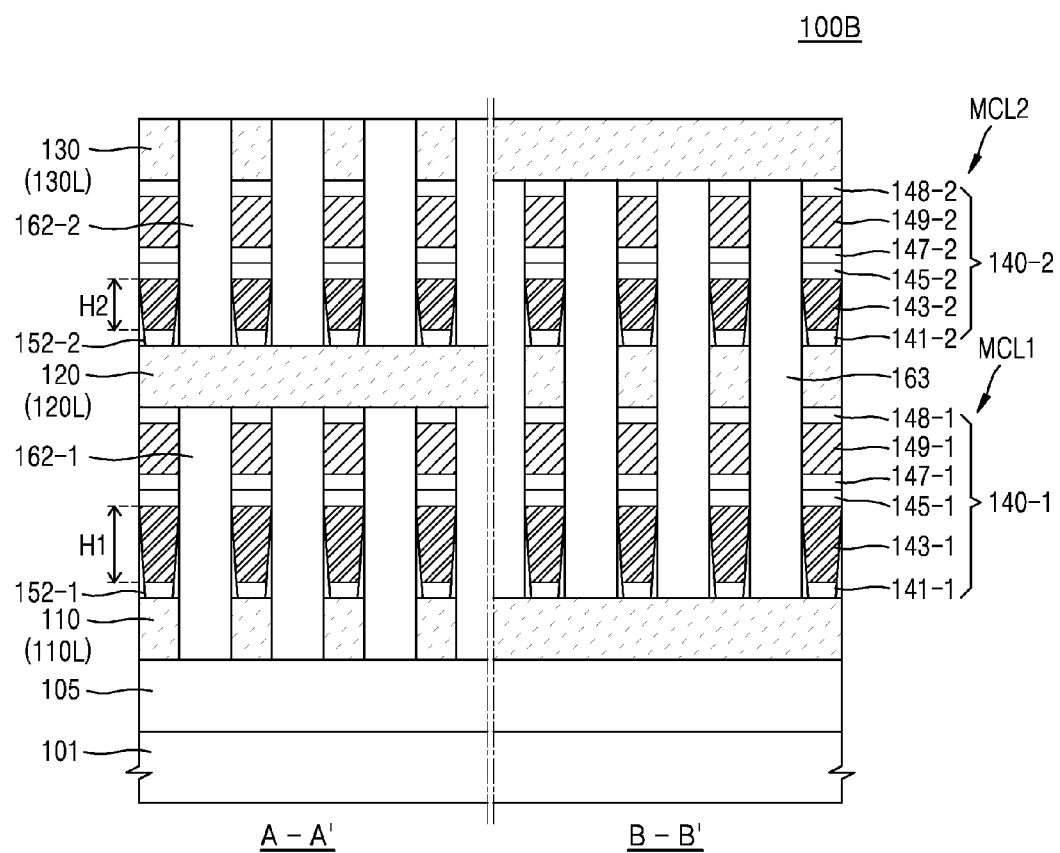

Referring to FIG. 8, in the memory device 100B according to an example embodiment, a first inner spacer 152-1 may be formed on a sidewall of the first memory cell 140-1 and a second inner spacer 152-2 may be formed on a sidewall of the second memory cell 140-2. The first inner spacer 152-1 may cover sidewalls of the first electrode layer 141-1 and the first selection element layer 143-1 of the first memory cell 140-1, and the second inner spacer 152-2 may cover sidewalls of the fifth electrode layer 141-2 and the second selection element layer 143-2 of the second memory cell 140-2. The first and second inner spacers 152-1 and 152-2 may enclose the sidewalls of the first and second memory cells 140-1 and 140-2 to protect the first and second memory cells 140-1 and 140-2, preferably the first and second selection element layers 143-1 and 143-2, respectively. For example, each of the first and second inner spacers 152-1 and 152-2 may include an insulating material.

Although the first height H1 of the first selection element layer 143-1 is greater than the second height H2 of the second selection element layer 143-2 as illustrated in FIG. 8, but aspects of the inventive concept are not limited thereto. For example, the first height H1 of the first selection element layer 143-1 is smaller than the second height H2 of the second selection element layer 143-2.

Although the first electrode layer 141-1 and the fifth electrode layer 141-2 have the same thickness as illustrated in FIG. 8, but aspects of the inventive concept are not limited thereto. For example, the thickness of the first electrode layer 141-1 is greater or smaller than that of the fifth electrode layer 141-2.

In some embodiments, the first electrode layer 141-1, the fifth electrode layer 141-2, and the first and second selection element layers 143-1 and 143-2 may be formed by a damascene process, the second through fourth electrode layers 145-1, 147-1, and 148-1, the sixth through eighth electrode layers 145-2, 147-2, and 148-2, and the first and second variable resistance layers 149-1 and 149-2 may be formed by an etching process. Accordingly, the first electrode layer 141-1, the fifth electrode layer 141-2, and the first and second selection element layers 143-1 and 143-2 may respectively have a structure in which a width (e.g., in the first or second direction) thereof is narrower downwardly.

In some embodiments, when the first electrode layer 141-1 and the first selection element layer 143-1 are formed by the damascene process, the first inner spacer 152-1 may be formed on a sidewall of a trench (not shown), and then the first electrode layer 141-1 and the first selection element layer 143-1 may be sequentially formed in the trench having the first inner spacer 152-1 to fill the trench. The second through fourth electrode layers 145-1, 147-1, and 148-1 and the first variable resistance layer 149-1 may be formed on the first selection element layer 143-1. The fifth electrode layer 141-2 and the second selection element layer 143-2 may be formed by a process similar to that of forming the first electrode layer 141-1 and the first selection element layer 143-1.

Figure 9:
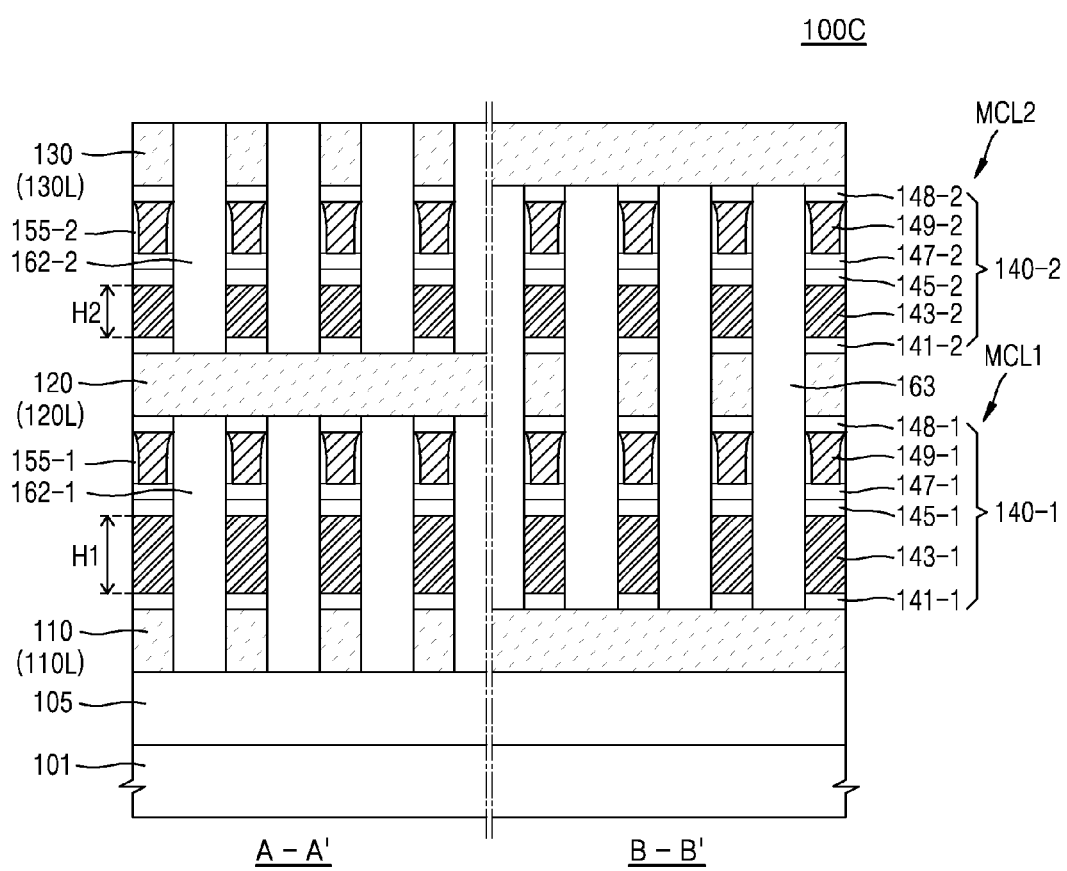

Referring to FIG. 9, in the memory device 100C according to an example embodiment, a first upper spacer 155-1 may be formed on a sidewall of the first memory cell 140-1 and a second upper spacer 155-2 may be formed on a sidewall of the second memory cell 140-2. The upper spacer 155-1 may cover a sidewall of the first variable resistance layer 149-1 of the first memory cell 140-1, and the second upper spacer 155-2 may cover a sidewall of the second variable resistance layer 149-2 of the second memory cell 140-2. The first and second upper spacers 155-1 and 155-2 may enclose the sidewalls of the first and second memory cells 140-1 and 140-2 to protect the first and second memory cells 140-1 and 140-2, preferably the first and second variable resistance layers 149-1 and 149-2, respectively. For example, each of the first and second upper spacers 155-1 and 155-2 may include an insulating material.

Although the first height H1 of the first selection element layer 143-1 is greater than the second height H2 of the second selection element layer 143-2 as illustrated in FIG. 9, but aspects of the inventive concept are not limited thereto. For example, the first height H1 of the first selection element layer 143-1 is smaller than the second height H2 of the second selection element layer 143-2.

In some embodiments, the first and second variable resistance layers 149-1 and 149-2 may be formed by a damascene process, the first through fourth electrode layers 141-1, 145-1, 147-1, and 148-1, the first and second selection element layers 143-1 and 143-2, and the fifth through eighth electrode layers 141-2, 145-2, 147-2, and 148-2, may be formed by an etching process. Accordingly, the first and variable resistance layers 149-1 and 149-2 may respectively have a structure in which a width (e.g., in the first or second direction) thereof is narrower downwardly.

In some embodiments, when the first variable resistance layer 149-1 is formed by the damascene process, the first upper spacer 155-1 may be formed on a sidewall of a trench (not shown), and then the first variable resistance layer 149-1 may be formed in the trench having the first upper spacer 155-1 to fill the trench. The second variable resistance layer 149-2 may be formed by a process similar to that of forming the first variable resistance layer 149-1.

In example embodiments, a memory device (not shown) may include a plurality of first memory cells 140-1 and a plurality of second memory cells 140-2. Each of the first memory cells 140-1 may include a first inner spacer 152-1 formed on sidewalls of a first selection element layer 143-1, and a first upper spacer 155-1 formed on sidewalls of a first variable resistance layer 149-1. Each of the second memory cells 140-2 may include a second inner spacer 152-2 formed on sidewalls of a second selection element layer 143-2, and a second upper spacer 155-2 formed on sidewalls of a second variable resistance layer 149-2.

Figure 10:
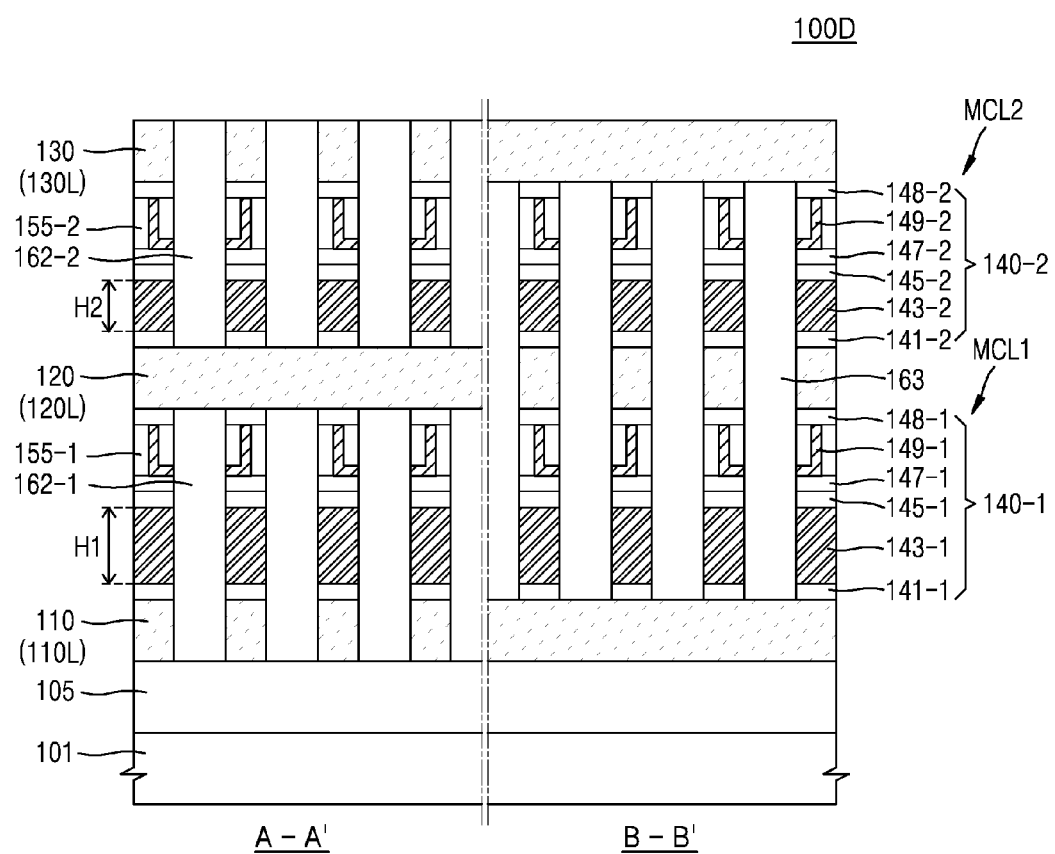

Referring to FIG. 10, in the memory device 100D according to an example embodiment, the first and second variable resistance layers 149-1 and 149-2 may be formed to have an "L" sectional shape. Specifically, the first through fourth electrode layers 141-1, 145-1, 147-1, and 148-1, the first and second selection element layers 143-1 and 143-2, and the fifth through eighth electrode layers 141-2, 145-2, 147-2, and 148-2 may be formed by an etching process, and the first and second variable resistance layers 149-1 and 149-2 may be formed by a damascene process.

The first and second upper spacer 155-1 and 155-2 may be formed on sidewalls of the first and second variable resistance layers 149-1 and 149-2, respectively. Since the first and second variable resistance layers 149-1 and 149-2 have the "L" sectional shape, the first and second upper spacers 155-1 and 155-2 may be respectively formed to be an asymmetrical structure.

According to an example process for forming the first and second variable resistance layers 149-1 and 149-2, an insulating layer may be formed on each of the third electrode layer 147-1 and the seventh electrode layer 147-2 and a trench may be formed in the insulating layer. The trench may be formed to be overlapped with respective ones of the adjacent first selection element layers 143-1 and the adjacent second selection element layers 143-2. A first material layer for forming the variable resistance layer may be formed thinly in the trench and on the insulating layer, and then a second material layer for forming the upper spacer may be formed. A planarization process such as a chemical mechanical polishing process may be performed on the first and second material layers until a top surface of the insulating layer is exposed. After the planarization process, the first and second material layers may be etched using a mask pattern to be aligned with the first and second memory cells 140-1 and 140-2 as an etch mask. Thus, the first and second variable resistance layers 149-1 and 149-2 may be formed to have the "L" sectional shape, and the first and second upper spacers 155-1 and 155-2 are formed on the sidewalls of first and second variable resistance layers 149-1 and 149-2, respectively.

Figure 11:
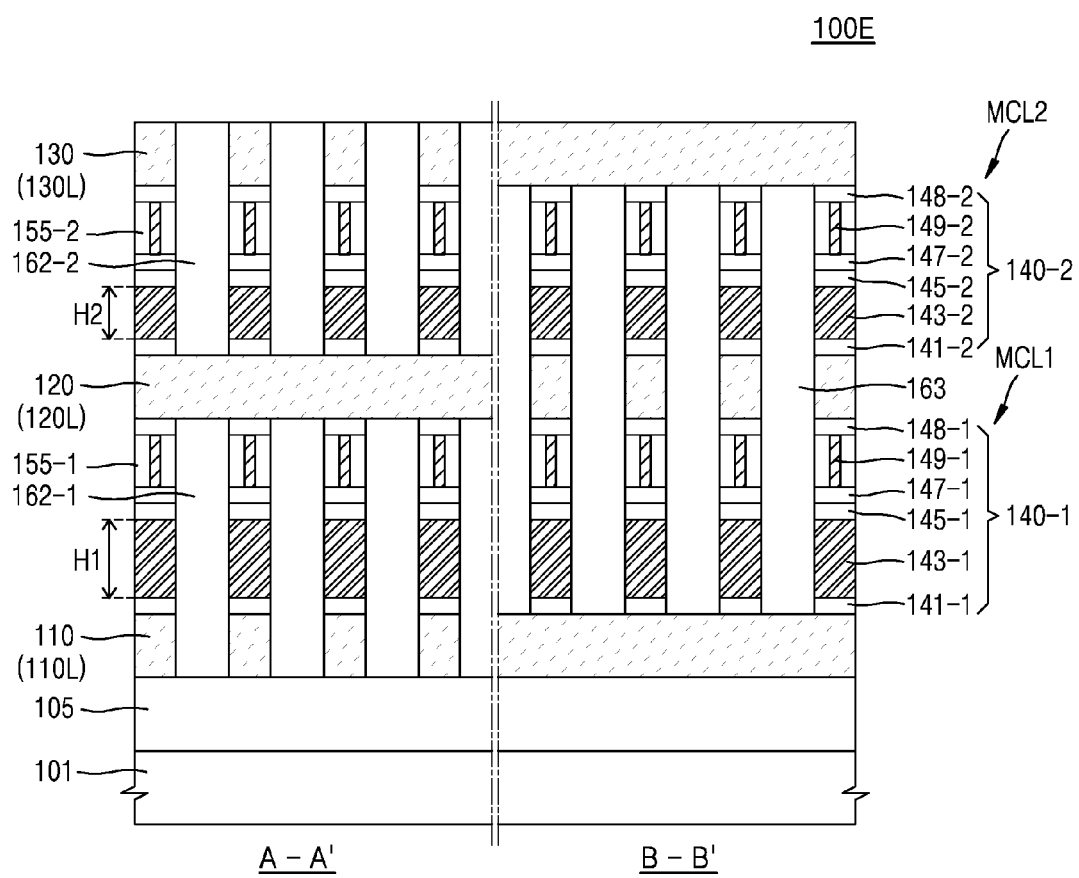

Referring to FIG. 11, in the memory device 100E according to an example embodiment, the first and second variable resistance layers 149-1 and 149-2 may be formed to have an "I" sectional shape. The first and second variable resistance layers 149-1 and 149-2 having the "I" sectional shape may be formed by a process similar to that of forming the first and second variable resistance layers 149-1 and 149-2 having the "L" sectional shape of FIG. 10. For example, after a first material layer for forming the variable resistance layer is formed thinly in the trench and on the insulating layer, an anisotropic etching process may be performed on the first material layer such that the first material layer remains only on a sidewall of the trench. A second material layer including an insulating material may be formed to cover the first material layer. The planarization process (e.g., chemical mechanical polishing process) may be performed to expose the top surface of the insulating layer. After the planarization process, the second material layer may be etched using a mask pattern to be aligned with the first and second memory cells 140-1 and 140-2 as an etch mask. Thus, the first and second variable resistance layers 149-1 and 149-2 may be formed to have the "I" sectional shape and the first and second upper spacers 155-1 and 155-2 are formed on the sidewalls of first and second variable resistance layers 149-1 and 149-2, respectively.

Figure 12:
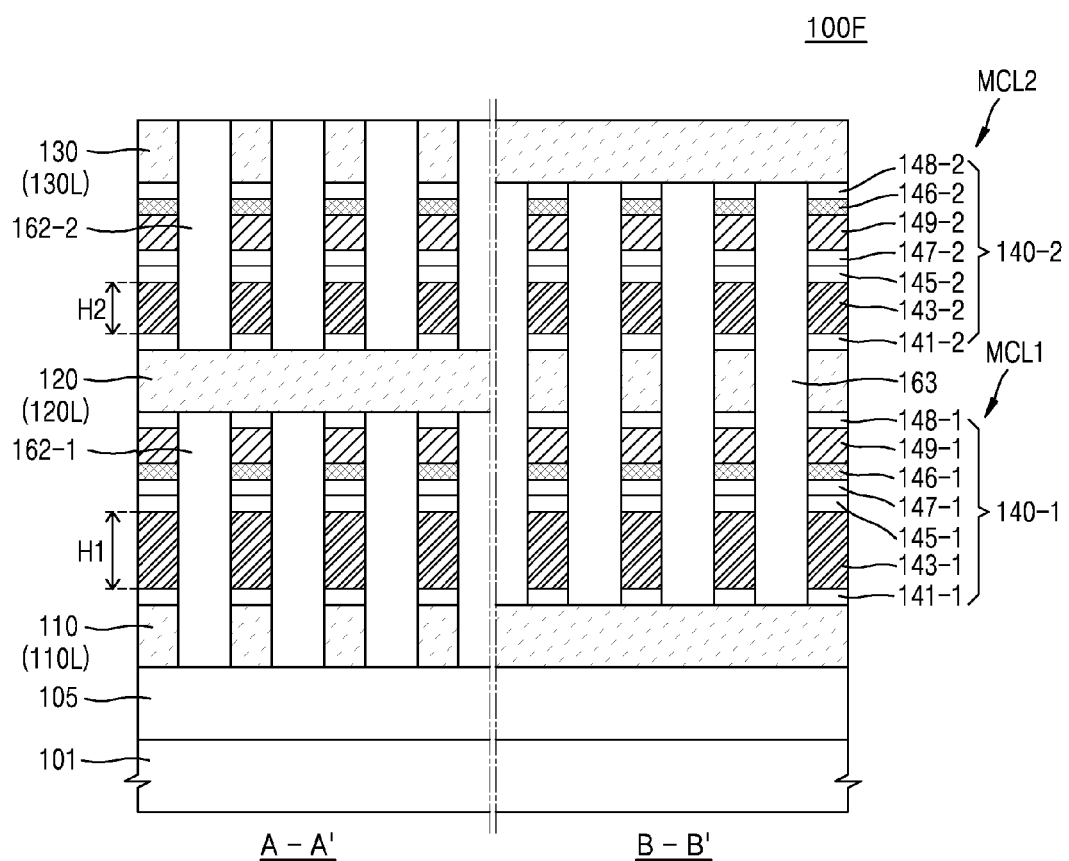

Referring to FIG. 12, in the memory device 100F according to an example embodiment, a first heating electrode layer 146-1 may further be formed between the first variable resistance layer 149-1 and the third electrode layer 147-1, and the second heating electrode layer 146-2 may be further formed between the second variable resistance layer 149-2 and the eighth electrode layer 148-2.

As illustrated in FIG. 12, the first variable resistance layer 149-1 and the first heating electrode layer 146-1 may be arranged in order in a direction toward the first conductive line 110 from the second conductive line 120, and the second variable resistance layer 149-2 and the second heating electrode layer 146-2 may be arranged in order in a direction toward the third conductive line 130 from the second conductive line 120. Thus, with respect to the second conductive line 120, the arrangement of the first variable resistance layer 149-1 and the first heating electrode layer 146-1 in the first memory cell 140-1 may be symmetrical to the arrangement of the second variable resistance layer 149-2 and the second heating electrode layer 146-2 in the second memory cell 140-2. Thus, a difference between a resistance value of the first variable resistance layer 149-1 and a resistance value of the second variable resistance layer 149-2 may be reduced. For example, when each of the first variable resistance layer 149-1 and the second variable resistance layer 149-2 includes GeSbTe, a diffusion rate of a positive ion (e.g., $Sb^+$) and a diffusion rate of a negative ion (e.g., $Te^+$) may be different from each other in the first and second variable resistance layers 149-1 and 149-2. When the negative voltage is applied to the first variable resistance layer 149-1 and the positive voltage is applied to the second variable resistance layer 149-2, in the first and second variable resistance layers 149-1 and 149-2, the difference between the diffusion rate of the negative ion and the diffusion rate of the positive ion may induce a local concentration change. Accordingly, the resistance value of the first variable resistance layer 149-1 and the resistance value of the second variable resistance layer 149-2 may be different from each other.

According to the example embodiment, since the stacked structure of the first variable resistance layer 149-1 and the first heating electrode layer 146-1 in the first memory cell 140-1 is symmetrical to the stacked structure of the second heating electrode layer 146-2 and the second variable resistance layer 149-2 in the second memory cell 140-2, with respect to the second conductive line 120, the difference between the resistance value of the first and the resistance value of second variable resistance layers 149-1 and 149-2 may be reduced such that each of the first and second memory cells 140-1 and 140-2 may have uniform operation property. The resistance value of each of the first and second variable resistance layers 149-1 and 149-2 is assumed in the same state (e.g., set or reset state).

Figure 13:
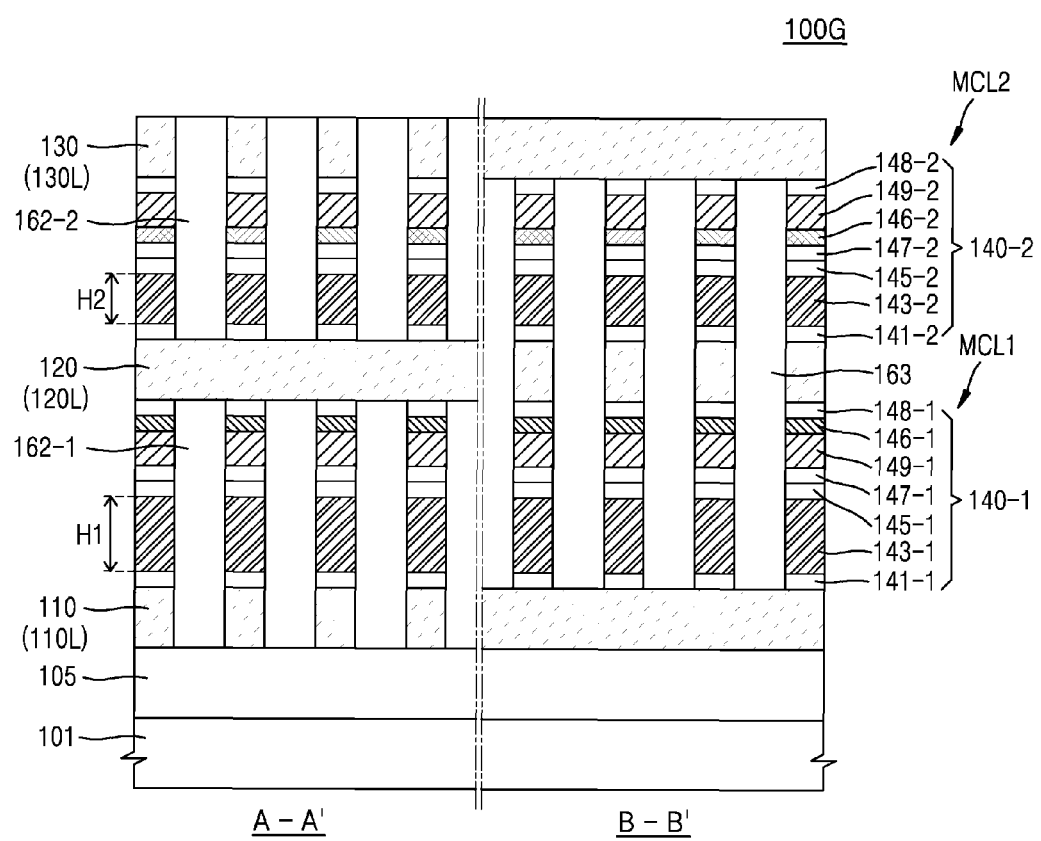

Referring to FIG. 13, in the memory device 100G according to an example embodiment, a first heating electrode layer 146-1 may further be formed between the first variable resistance layer 149-1 and the fourth electrode layer 148-1, and the second heating electrode layer 146-2 may be further formed between the second variable resistance layer 149-2 and the seventh electrode layer 147-2.

As illustrated in FIG. 13, with respect to the second conductive line 120, the arrangement of the first variable resistance layer 149-1 and the first heating electrode layer 146-1 in the first memory cell 140-1 may be symmetrical to the arrangement of the second variable resistance layer 149-2 and the second heating electrode layer 146-2 in the second memory cell 140-2. As described above, the difference between the resistance value of the first variable resistance layer 149-1 and the resistance value of the second variable resistance layer 149-2 may be reduced such that each of the first and second memory cells 140-1 and 140-2 may have uniform operation property.

Although the first height H1 of the first selection element layer 143-1 is greater than the second height H2 of the second selection element layer 143-2 as illustrated in FIGS. 10 through 13, but aspects of the inventive concepts are not limited thereto. For example, the first height H1 of the first selection element layer 143-1 may be formed to be smaller than the second height H2 of the second selection element layer 143-2.

In the example embodiments described with reference to FIGS. 1 through 13, the structure in which the first and second memory cells 140-1 and 140-2 are vertically arranged between the first through third conductive lines 110, 120 and 130 is described, but aspects of the inventive concepts are not limited thereto. In some embodiments, an insulating layer (not shown) may be formed on the third conductive line 130, and at least one stack structure having the cross-point array as described with reference to FIGS. 1 through 13 may be disposed on the insulating layer.

Figure 14:
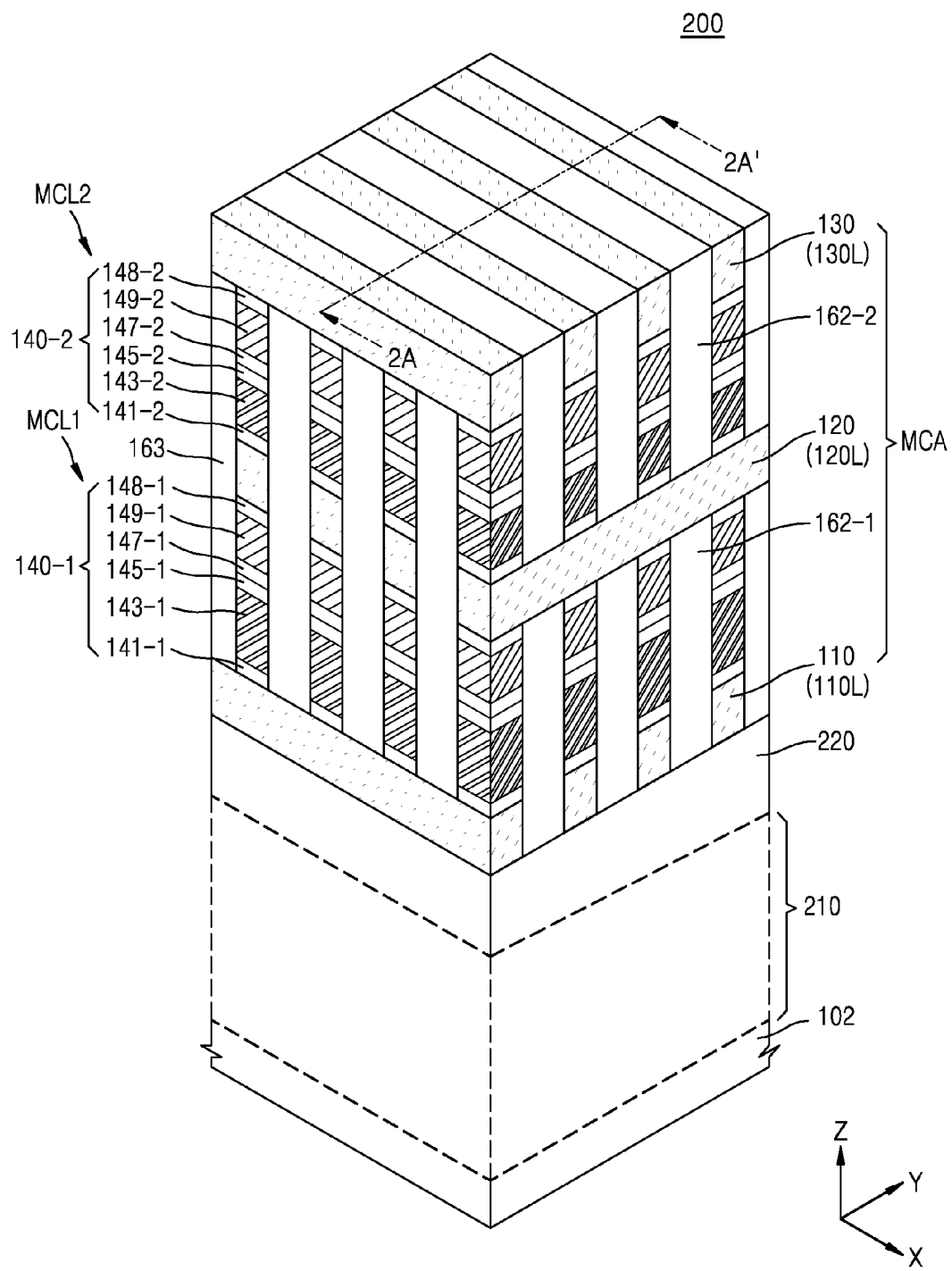
FIG. 14 is a perspective view illustrating a memory device according to example embodiments.
Figure 15:
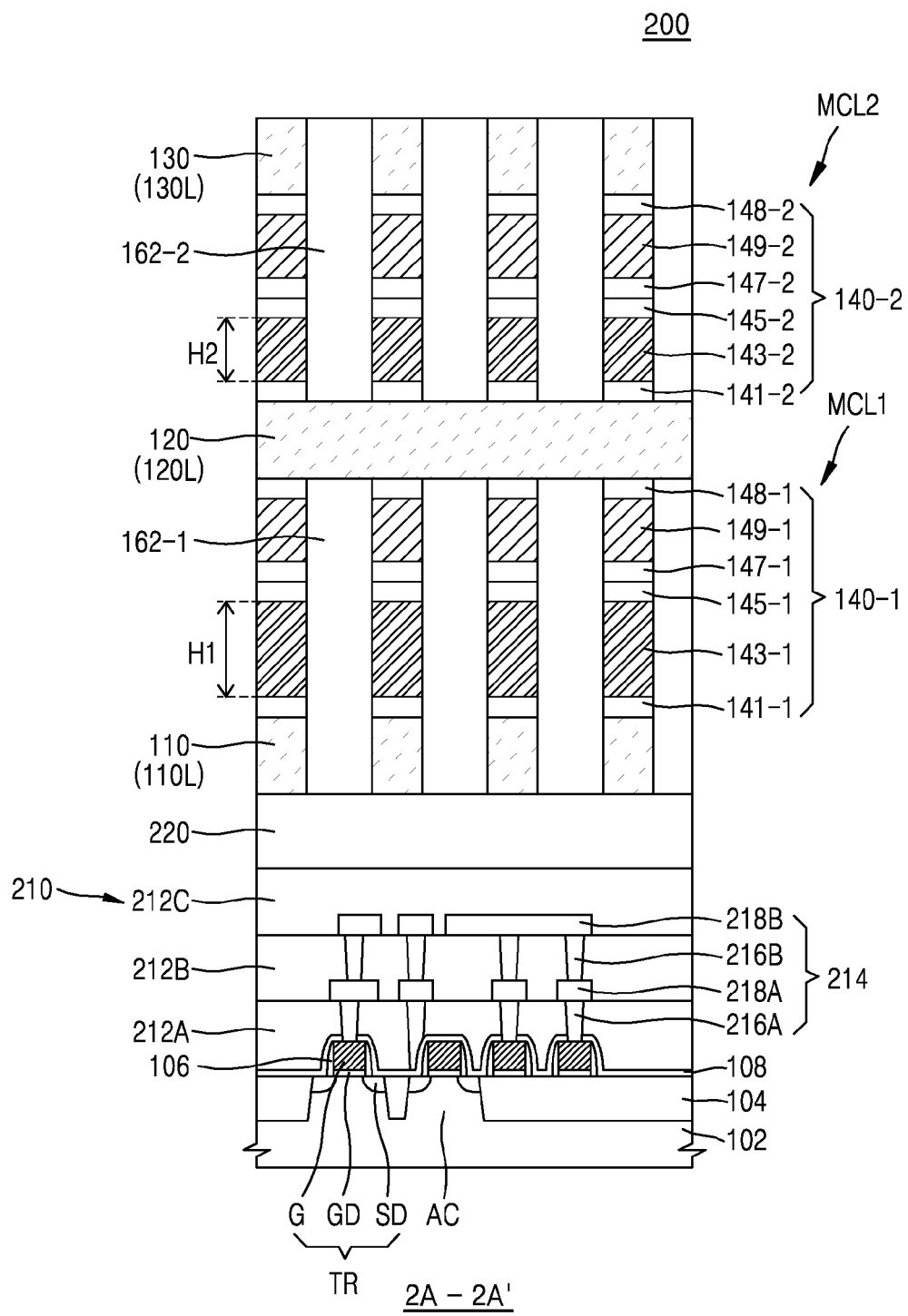
FIG. 15 is a cross-sectional view taken along line 2A-2A' of FIG. 14 according to example embodiments.

FIG. 14 is a perspective view illustrating a memory device 200 according to example embodiments, and FIG. 15 is a cross-sectional view taken along line 2A-2A' of FIG. 14 according to example embodiments.

Referring to FIGS. 14 and 15, the memory device 200 may include a drive circuit region 210 disposed at a first level on a substrate 102 and a memory cell array region MCA disposed at a second level on the drive circuit region 210.

Here, the level means a height (or position) from the substrate 102 in a vertical direction (i.e., Z-direction of FIGS. 14 and 15). The first level is closer to the substrate 102 than the second level. The drive circuit region 210 may be a region where peripheral circuits (or drive circuits) for driving memory cells in the memory cell region MCA are disposed. For example, the peripheral circuits in the drive circuit region 210 may include circuits processing data that is input to or output from the memory cells in the memory cell array region MCA. The peripheral circuits may include, for example, a page buffer, a latch circuit, a cache circuit, a column decoder, a sense amplifier, a data in/out circuit, or a row decoder.

An active region AC for the peripheral circuits (or the drive circuits) may be defined by a device isolation layer 104 in the substrate 102. A plurality of transistors TR constituting the peripheral circuits in the drive circuit region 210 may be formed on and in the active region AC. The plurality of transistors TR may each include a gate G, a gate insulating layer GD, and source/drain regions SD. An insulating spacer 106 may be formed on opposite sidewalls of the gate G, and an etch stop layer 108 may be formed on the gate G and the insulating spacer 106. The etch stop layer 108 may include an insulating material, for example, silicon nitride or silicon oxynitride.

A plurality of interlayer insulating layers 212A, 212B, and 212C may be sequentially stacked on the etch stop layer 108. Each of the plurality of interlayer insulating layers 212A, 212B, and 212C may include, for example, silicon oxide, silicon nitride, and/or silicon oxynitride.

The drive circuit region 210 may include a multilevel interconnection structure 214 which are electrically connected to the plurality of transistors TR. The multilevel interconnection structure 214 may be covered by the plurality of interlayer insulating layers 212A, 212B, and 212C. The multilevel interconnection structure 214 may include a first contact 216A, a first interconnection layer 218A, a second contact 216b, and a second interconnection layer 218B which are sequentially on the substrate 102 to be electrically connected to each other. The first and second interconnection layers 218A and 218B may include a metal, a conductive metal nitride, a metal silicide, or a combination thereof. The first and second interconnection layers 218A and 218B may include, for example, tungsten, molybdenum, titanium, cobalt, tantalum, nickel, tungsten silicide, titanium silicide, cobalt silicide, tantalum silicide, or nickel silicide.

Although the multilevel interconnection structure 214 includes a two-level interconnection structure including the first interconnection layer 218A and the second interconnection layer 218B as illustrated in FIG. 15, aspects of the inventive concepts are not limited thereto. For example, according to a layout of the drive circuit region 210, and an arrangement or types of the gate G, the multilevel interconnection structure 214 may include a tree-or-more-level interconnection structure.

An upper interlayer insulating layer 220 may be formed on the interlayer insulating layer 212C. The memory cell array region MCA may be disposed on the upper interlayer insulating layer 220. In the memory cell array region MCA, at least one of the memory devices 100, 100A, 100B, 100C, 100D, 100E, 100F, and 100G as described with reference to FIGS. 1 through 13 or a combination thereof may be disposed.

An interconnection structure (not shown) penetrating the upper interlayer insulating layer 220 may be further disposed to electrically connect the memory cells in the memory cell array region MCA to the peripheral circuits in the drive circuit region 210.

In the memory device 200 according to example embodiments, since the memory cell array region MCA is disposed on the drive circuit region 210, an integration of the memory device 200 may be increased.

Although the first height H1 of the first selection element layer 143-1 is greater than the second height H2 of the second selection element layer 143-2 as illustrated in FIG. 15, aspects of the inventive concepts are not limited thereto. For example, the first height H1 of the first selection element layer 143-1 may be formed to be smaller than the second height H2 of the second selection element layer 143-2.

FIGS. 16A through 16I are cross-sectional views illustrating stages of a method of manufacturing a memory device 100 according to example embodiments.

The method of manufacturing the memory device 100 as illustrated in FIGS. 2 and 3 is described with reference to FIGS. 16A through 16I. FIGS. 16A through 16I illustrate cross-sectional configurations corresponding to cross-sections taken along lines A-A' and B-B' of FIG. 2 in accordance with the process stages. The same reference numerals are used to denote the same elements as in FIGS. 1 through 15, and repeated descriptions thereof are omitted for brevity.

Figure 16A:
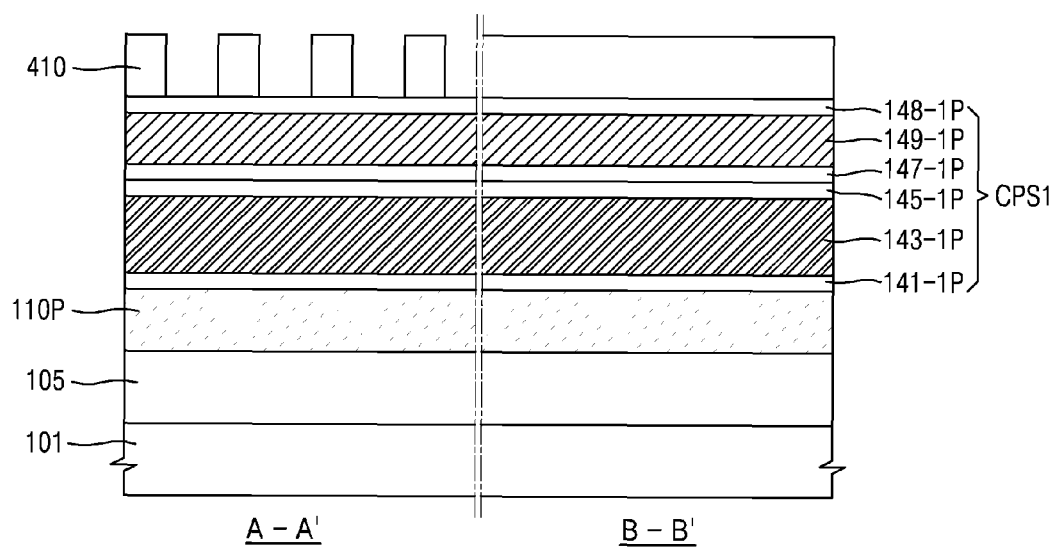
FIGS. 16A through 16I are cross-sectional views illustrating stages of a method of manufacturing a memory device according to example embodiments.

Referring to FIG. 16A, an interlayer insulating layer 105 may be formed on a substrate 101. The interlayer insulating layer 105 may be formed of at least one of silicon oxide, silicon nitride, and silicon oxynitride.

A first conductive layer 110P may be formed on the interlayer insulating layer 105, and a first stack structure CPS1, in which a preliminary first electrode layer 141-1P, a preliminary first selection element layer 143-1P, a preliminary second electrode layer 145-1P, a preliminary third electrode layer 147-1P, a preliminary first variable resistance layer 149-1P, and a preliminary fourth electrode layer 148-1P are sequentially formed on the first conductive layer 110P, may be formed. The first stack structure CPS1 may serve to form a cross-point array.

The first conductive layer 110P, the preliminary first electrode layer 141-1P, the preliminary first selection element layer 143-1P, the preliminary second electrode layer 145-1P, the preliminary third electrode layer 147-1P, the preliminary first variable resistance layer 149-1P, and the preliminary fourth electrode layer 148-1P may be formed of the same materials as those of the first conductive line 110, the first electrode layer 141-1, the first selection element layer 143-1, the second electrode layer 145-1, the third electrode layer 147-1, the first variable resistance layer 149-1, and the fourth electrode layer 148-1 as described with reference to FIGS. 2 and 3.

A first mask pattern 410 may be formed on the preliminary fourth electrode layer 148-1P.

The first mask pattern 410 may include a plurality of line patterns which extend in the first direction (X-direction of FIG. 2) and are spaced apart from each other in the second direction (Y-direction of FIG. 2). The first mask pattern 410 may include a single layer or a multilayer stack. The first mask pattern 410 may include, for example, a photoresist pattern, a silicon oxide pattern, a silicon nitride pattern, a silicon oxynitride pattern, a poly-silicon pattern, or a combination thereof, but not limited thereto. The first mask pattern 410 may be formed of various materials.

Figure 16B:
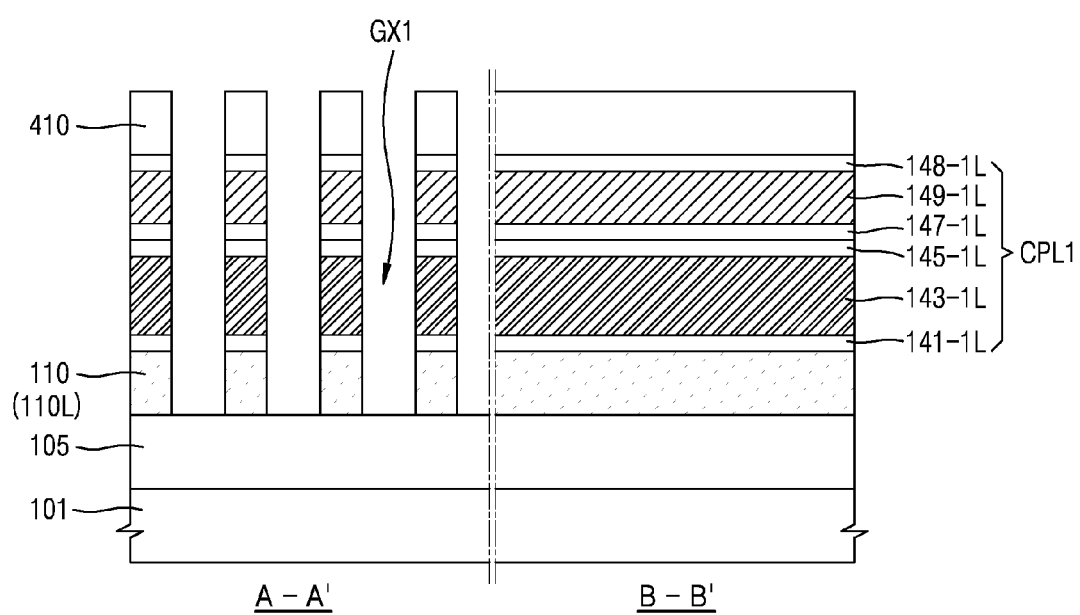

FIG. 16B, the first stack structure CPS1 and the first conductive layer 110P may be sequentially anisotropically etched using the first mask pattern 410 as an etching mask such that the first stack structure CPS1 is separated into a plurality of first stack lines CPL1 and the first conductive layer 110P is separated into a plurality of first conductive lines 110.

As a result, the plurality of first conductive lines 110 and the plurality of first stack lines CPL1 may be formed to extend in the first direction. The plurality of first conductive lines 110 may be spaced apart from each other in the second direction, and the plurality of first stack lines CPL1 may be spaced apart from each other in the second direction. The plurality of first conductive lines 110 may form the first conductive line layer 110L. The plurality of first stack lines CPL1 may each include a first electrode layer line 141-1L, a first selection element layer line 143-1L, a second electrode layer line 145-1L, a third electrode layer line 147-1L, a first variable resistance layer line 149-1L, and a fourth electrode layer line 148-1L.

Also, a plurality of first gaps GX1 may be formed between the plurality of conductive lines 110 and between the plurality of first stack lines CPL1 by an anisotropic etching process. The plurality of first gaps GX1 may extend in the first direction and may be spaced apart from each other in the second direction. A portion of a top surface of the substrate 101 may be exposed by the plurality of first gaps GX1.

Figure 16C:
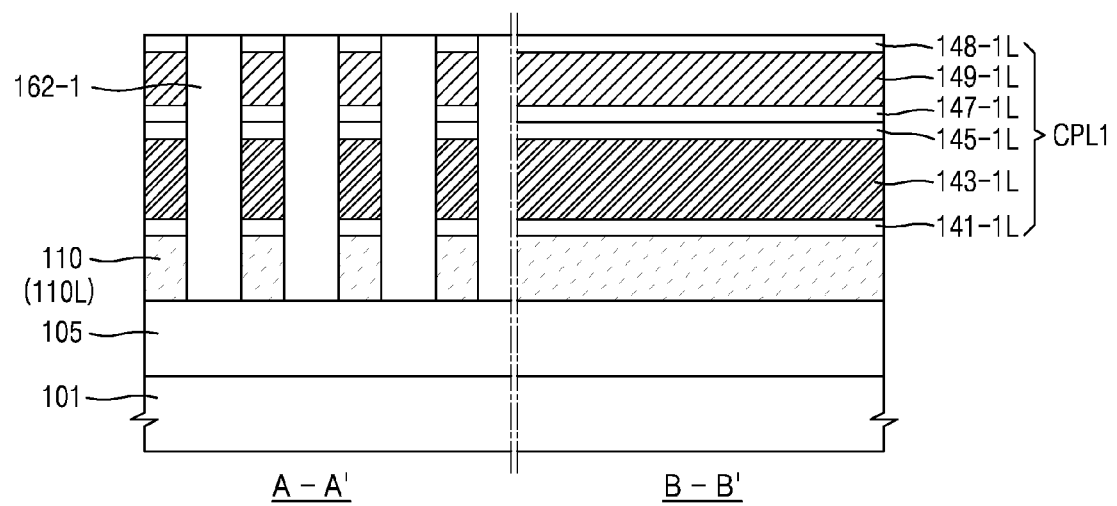

Referring to FIG. 16C, the mask pattern 410 may be removed to expose a top surface of the fourth electrode line 148-1L, and then a first insulating layer 162-1 may be formed to fill the plurality of first gaps GX1.

In some embodiments, the formation of the first insulating layer 162-1 may include forming insulating material on the substrate 101 to fill the plurality of first gaps GX1 and planarizing an upper portion of the insulating material until top surfaces of the plurality of first stack lines CPL1 are exposed. The first insulating layer 162-1 may include, for example, a silicon oxide layer, a silicon nitride layer, and/or a silicon oxynitride layer. The first insulating layer 162-1 may be made of one type of an insulating layer or a plurality of insulating layers, but not limited thereto.

Figure 16D:
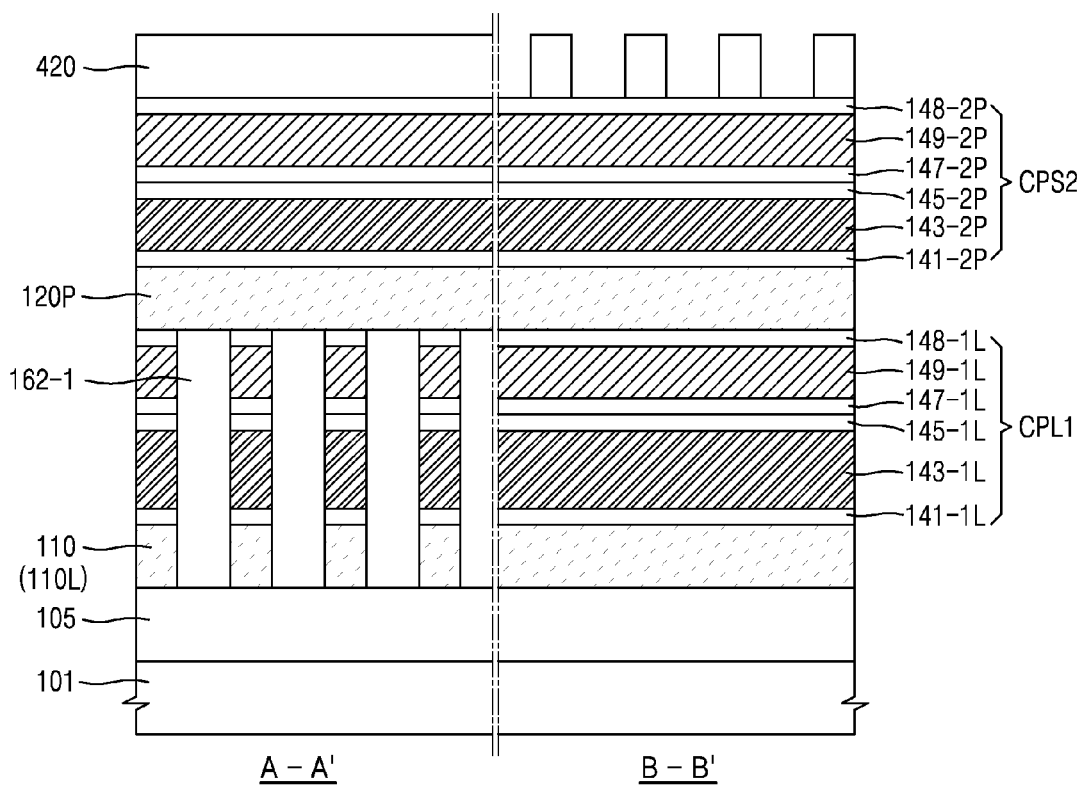

Referring to FIG. 16D, a second conductive layer 120P may be formed on an exposed top surface of the fourth electrode line 148-1L and an exposed top surface of the first insulating layer 162-1.

A second stack structure CPS2 may be formed on the second conductive layer 120P. The second stack structure CPS2 may include a preliminary fifth electrode layer 141-2P, a preliminary second selection element layer 143-2P, a preliminary sixth electrode layer 145-2P, a preliminary seventh electrode layer 147-2P, a preliminary second variable resistance layer 149-2P, and a preliminary eighth electrode layer 148-2P which are sequentially formed on the second conductive layer 120P.

The second conductive layer 120P, the preliminary fifth electrode layer 141-2P, the preliminary second selection element layer 143-2P, the preliminary sixth electrode layer 145-2P, the preliminary seventh electrode layer 147-2P, the preliminary second variable resistance layer 149-2P, and the preliminary eighth electrode layer 148-2P may be formed of the same materials as those of the second conductive line 120, the fifth electrode layer 141-2, the second selection element layer 143-2, the sixth electrode layer 145-2, the seventh electrode layer 147-2, the second variable resistance layer 149-2, and the eighth electrode layer 148-2 as described with reference to FIGS. 2 and 3.

A mask pattern 420 may be formed on the preliminary eighth electrode layer 148-2P. The mask pattern 420 may include a plurality of line patterns which extend in the second direction and are spaced apart from each other in the first direction.

Figure 16E:
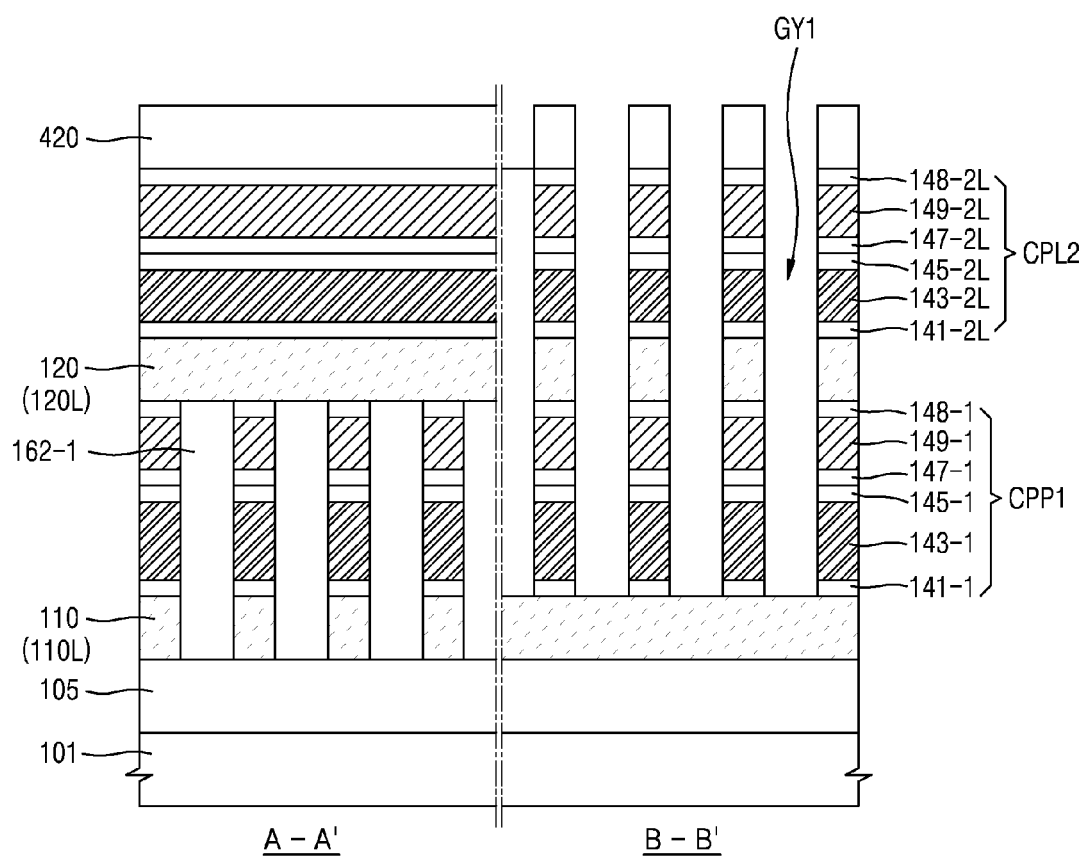

Referring to FIG. 16E, the second stack structure CPS2, the second conductive layer 120P, and the plurality of first stack lines CPL1 may be sequentially anisotropically etched using the second mask pattern 420 as an etch mask pattern such that the second stack structure CPS2 is separated into a plurality of second stack lines CPL2, the second conductive layer 120P is separated into a plurality of second conductive lines 120, and the plurality of first stack lines CPL1 are separated into a plurality of first stack patterns CPP1.

As a result, the plurality of second stack lines CPL2 may extend in the second direction and may be spaced apart from each other in the first direction, and the plurality of second conductive lines 120 may extend in the second direction and may be spaced apart from each other in the first direction. Also, the plurality of first stack patterns CPP1 may be spaced apart from each other in the first and second directions. The plurality of second conductive lines 120 may form a second conductive line layer 120L. The plurality of second stack lines CPL2 may each include a fifth electrode layer line 141-2L, a second selection element layer line 143-2L, a sixth electrode layer line 145-2L, a seventh electrode layer line 147-2L, a second variable resistance layer line 149-2L, and an eighth electrode layer line 148-2L. The plurality of first stack patterns CPP1 may include a first electrode layer 141-1, a first selection element layer 143-1, a second electrode layer 145-1, a third electrode layer 147-1, a first variable resistance layer 149-1, and a fourth electrode layer 148-1.

Also, a plurality of second gaps GY1 may be formed between the plurality of second stack lines CPL2, between the plurality of second lines 120, and between the plurality of first stack patterns CPP1 may be formed by the anisotropic etching process. The plurality of second gaps GY1 may extend in the second direction and may be spaced apart from each other in the first direction.

In some embodiments, the anisotropic etching process may be performed until top surfaces of the plurality of first conductive lines 110. Although not illustrated, a recess having a certain depth may be formed in upper portions of the plurality of first conducive lines 110 by the anisotropic etching process.

In some embodiments, the anisotropic etching process may be performed until top surfaces of the first electrode layer lines 141-1L are exposed, and then an etching process may be performed at an etching condition in which the first electrode layer lines 141-1L have an etching selectivity with respect to the plurality of first conductive lines 110 to remove a portion of each of the first electrode layer lines 141-1L exposed by the plurality of second gaps GY1 such that the top surfaces of the plurality of first conductive lines 110 are exposed.

Figure 16F:
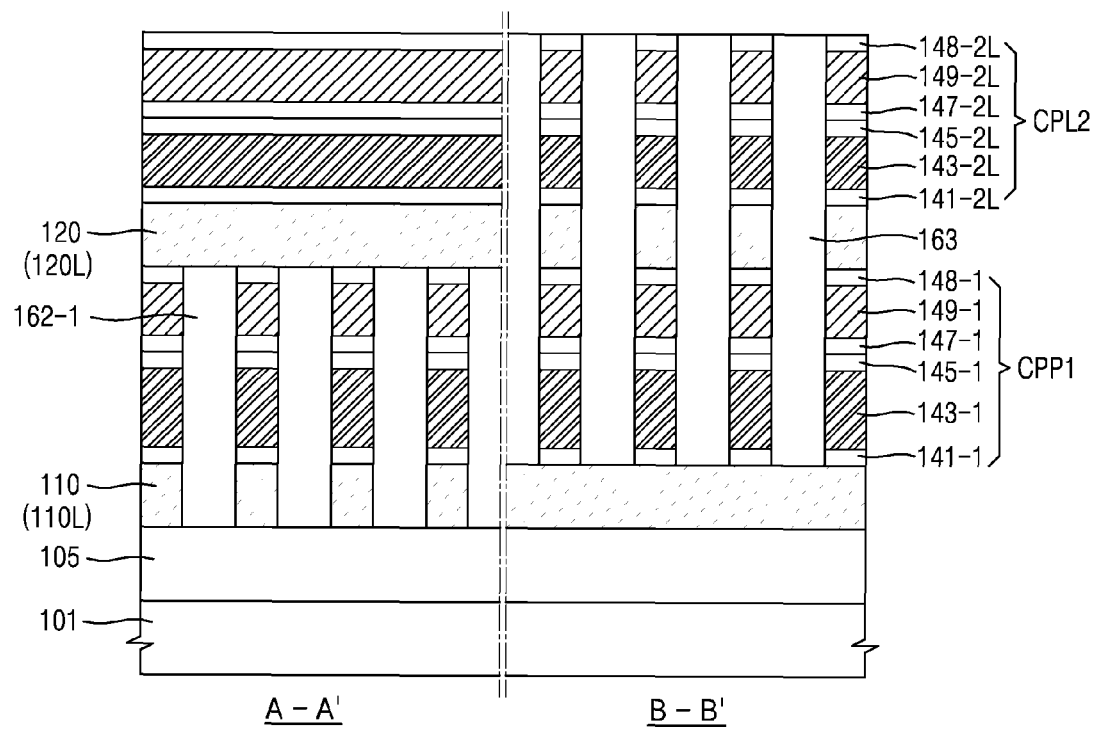

Referring to FIG. 16F, the second mask pattern 420 may be removed to expose top surfaces of the plurality of second stack lines CPL2. A second insulating layer 163 may be formed to fill the plurality of second gaps GY1.

In some embodiments, the formation of the second insulating layer 163 may include forming an insulating material on the plurality of first conductive lines 110, on sidewalls of the plurality of first stack patterns CPP1, and on sidewalls of the plurality of second stack lines CPL2 to fill the plurality of second gaps GY1, and planarizing an upper portion of the insulating material until top surfaces of the plurality of second stack lines CPL2 are exposed.

Figure 16G:
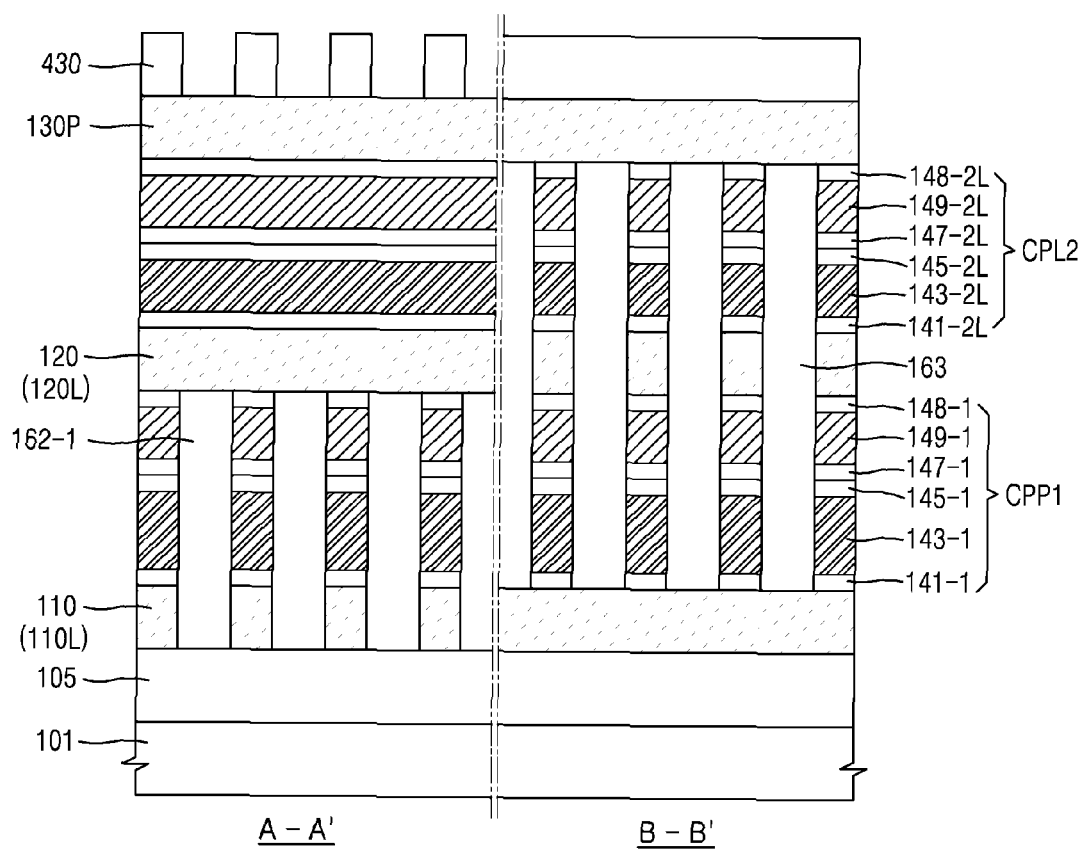

Referring to FIG. 16G, a third conductive layer 130P may be formed on the plurality of second stack lines CPL2 and the second insulating layer 163.

A third mask pattern 430 may be formed on the third conductive layer 130P. The third mask pattern 430 may include a plurality of line patterns which extend in the first direction and are spaced apart from each other in the second direction.

Figure 16H:
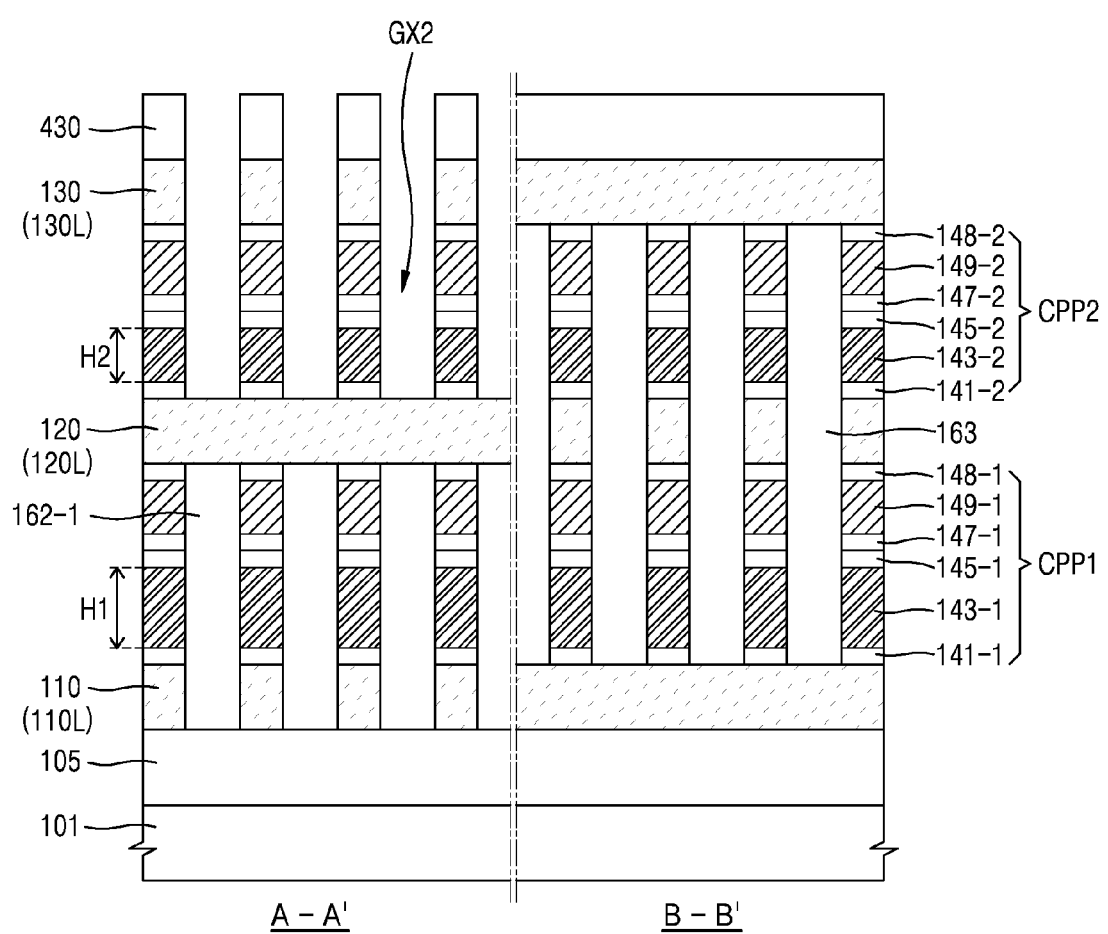

Referring to FIG. 16H, the third conductive layer 130P and the plurality of second stack lines CPL2 may be sequentially anisotropically etched using the third mask pattern 430 as an etching mask such that the third conductive line 130P is separated into a plurality of third conductive lines 130 and the plurality of second stack lines CPL2 are separated into a plurality of second stack patterns CPP2.

As a result, the plurality of third conductive lines 130 may extend in the first direction and may be spaced apart from each other in the second direction, the plurality of second stack patterns CPP2 may be spaced apart from each other in the first and second directions. The plurality of third conductive lines 130 may form a third conductive line layer 130L. The plurality of second stack patterns CPP2 may include a fifth electrode layer 141-2, a second selection element layer 143-2, a sixth electrode layer 145-2, a seventh electrode layer 147-2, a second variable resistance layer 149-2, and an eighth electrode layer 148-2.

Also, a plurality of third gaps GX2 may be formed between the plurality of third conductive lines 130 and between the plurality of second stack patterns CPP2 by the anisotropic etching process. The plurality of third gaps GX2 may extend in the first direction and may be spaced apart from each other in the second direction.

In some embodiments, the anisotropic etching process may be performed until top surfaces of the plurality of second conductive lines 120. Although not illustrated, a recess having a certain depth may be formed in upper portions of the plurality of second conducive lines 120 by the anisotropic etching process.

In some embodiments, the anisotropic etching process may be performed until top surfaces of the fifth electrode layer lines 141-2L are exposed, and then an etching process performed at an etching condition in which the fifth electrode layer lines 141-2L have an etching selectivity with respect to the plurality of second conductive lines 120 to remove a portion of each of the fifth electrode layer lines 141-2L exposed by the plurality of third gaps GX2 such that the top surfaces of the plurality of second conductive lines 120 are exposed.

Figure 16I:
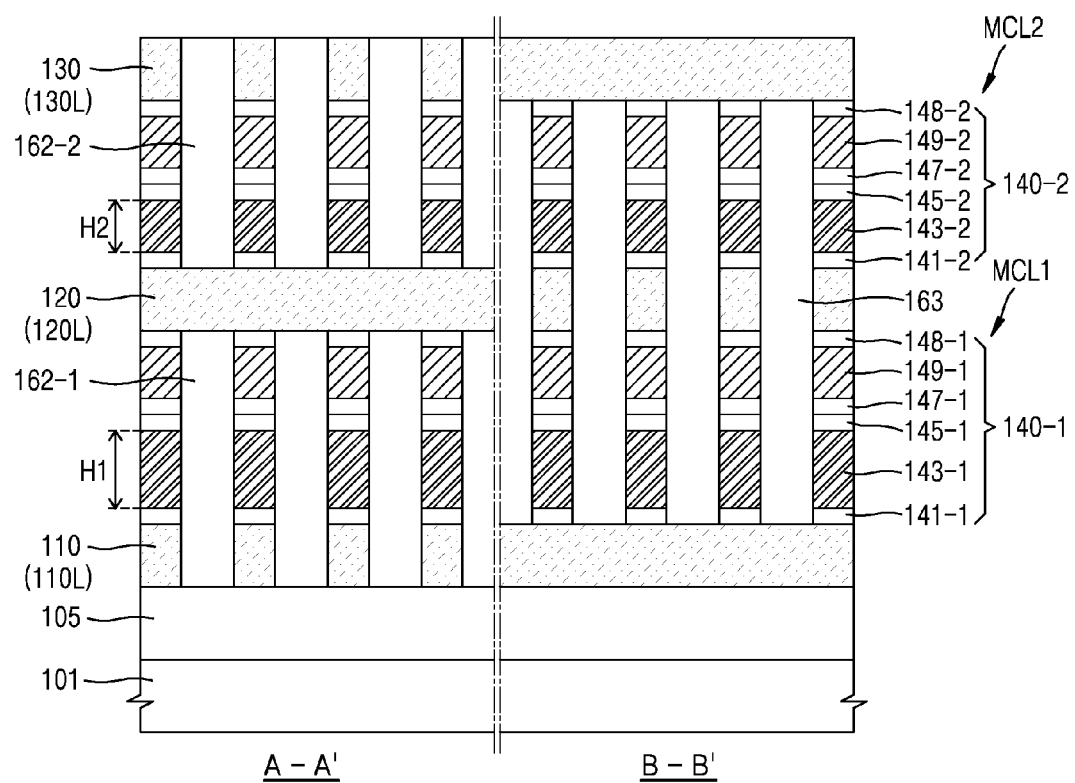

Referring to FIG. 16I, the third mask pattern 430 may be removed to expose top surfaces of the plurality of second stack patterns CPP2. A third insulating layer 162-2 may be formed to fill the plurality of third gaps GX2.

In some embodiments, the formation of the third insulating layer 162-2 may include forming an insulating material on the plurality of third conductive lines 130 and on sidewalls of the plurality of second stack patterns CPP2 to fill the plurality of third gaps GX2, and planarizing an upper portion of the insulating material to expose top surfaces of the plurality of third conductive lines 130.

As a result, the memory device 100 may be accomplished by performing the processes described above.

The plurality of first stack patterns CPP1 may be a plurality of first memory cells 140-1 and the plurality of second stack patterns CPP2 may be a plurality of second memory cells 140-2. In addition, the plurality of first memory cells 140-1 may form a first memory cell layer MCL1 and the plurality of second memory cells 140-2 may form a second memory cell layer MCL2.

According to the method of manufacturing the memory device 100, a first patterning process using the first mask pattern 410 extending in the first direction, a second patterning process using the second mask pattern 420 extending in the second direction, and a third patterning process using the third mask pattern 430 extending in the first direction may be sequentially performed. As a result, the plurality of first conductive lines 110 extending in the first direction, the plurality of second conductive lines 120 extending in the second direction, the plurality of third conductive lines 130 extending in the first direction, the plurality of first memory cells 140-1 at respective intersections of the plurality of first conductive lines 110 and the plurality of second conductive lines 120, and the plurality of second memory cells 140-2 at respective intersections of the plurality of second conductive lines 120 and the plurality of third conductive lines 130 may be formed.

Thus, since the plurality of first and second memory cells 140-1 and 140-2 are formed using only three patterning processes, degradation or damages of the first and second variable resistance layers 149-1 and 149-2 and/or the first and second selection element layers 143-1 and 143-2 due to exposure to an etching atmosphere during the patterning processes may be prevented. Further, the manufacturing cost of the memory device 100 may be reduced.

Figure 17:
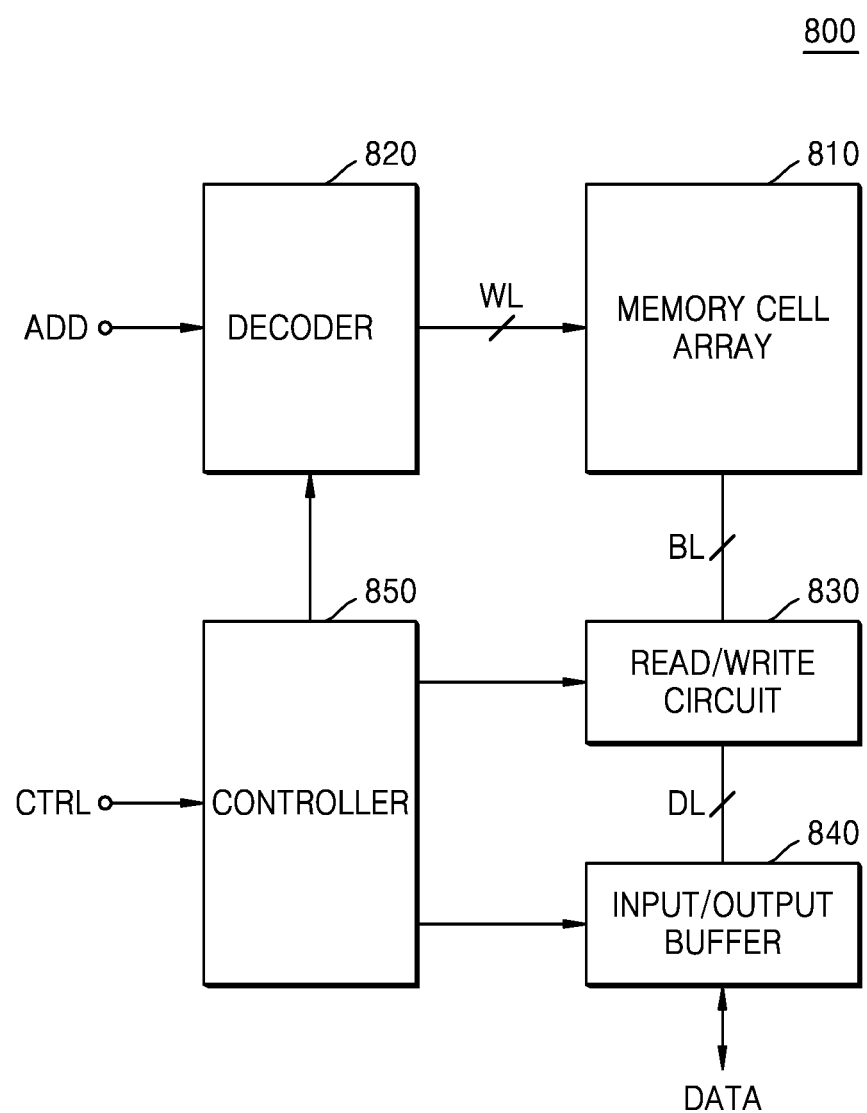
FIG. 17 is a block diagram illustrating a memory device according to certain embodiments.

FIG. 17 is a block diagram illustrating a memory device according to certain embodiments.

Referring to FIG. 17, a memory device 800 may include a memory cell array 810, a decoder, a read/write circuit 830, an input/output buffer, and a controller 850. The memory cell array 810 may include at least one of the memory devices 100, 100A, 100B, 100C, 100D, 100E, 100F, 100G, and 200 which are described with reference to FIGS. 1 through 15.

A plurality of memory cells in the memory cell array 810 may be connected to the decoder 820 through a plurality of word lines WL and may be connected to the read/write circuit 830 through a plurality of bit lines BL. The decoder 820 may receive addresses ADD from the outside of the memory device 800 and may decode a low address and a column address to access in the memory cell array 810 by control of the controller 850 operating in response to a control signal CTRL.

The read/write circuit 830 may receive data from the input/output buffer and a plurality of data lines DL and may write the received data in the selected memory cell of the memory cell array 810 by control of the controller 850. The read/write circuit 830 may read data from the selected memory cell of memory cell array 810 by control of the controller 850 and may transfer the read data to the input/output buffer.

Figure 18:
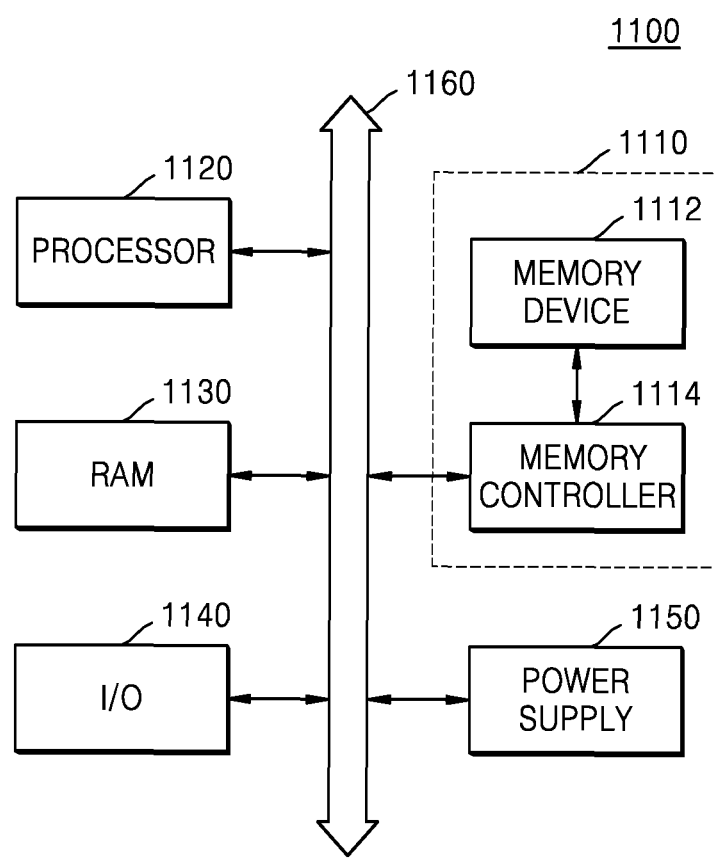
FIG. 18 is a block diagram illustrating an electronic system according to certain embodiments.

FIG. 18 is a block diagram illustrating an electronic system according to certain embodiments.

Referring to FIG. 18, an electronic system 1100 may include a memory system 1110, a processor 1120, a random access memory (RAM) 1130, an input/output (I/O) unit 1140, a power supply unit 1150. The memory system 1110 may include a memory device 1112 and a memory controller 1114. Although not shown, the electronic system 1100 may further include ports which communicate with a video card, a sound card, a memory card, an USB device, or other electronic device. The electronic system 1100 may be a personal computer or a mobile electronic device such as a notebook computer, a mobile phone, a personal digital assistant (PDA), or a camera.

The processor 1120 may perform specific calculations or tasks. The processor 1120 may be a microprocessor or a central processing unit (CPU). The processor 1120 may communicate with the RAM 1130, the I/O unit 1140, and the memory system 1110 through a bus 1160 such as an address bus, a control bus, or a data bus. Here, the memory system 1110 or the RAM 1130 may include at least one of the memory devices 100, 100A, 100B, 100C, 100D, 100E, 100F, 100G, and 200 described with reference to in FIGS. 1 through 15.

In some embodiments, the processor 1120 may be connected to an expansion bus such as a peripheral component interconnection (PCI) bus.

The RAM 1130 may store data which is necessary for operating the electronic system 1100. The RAM 1130 may include a DRAM, a mobile DRAM, an SRAM, a ReRAM, a FRAM, a MRAM, or a PRAM.

The I/O unit 1140 may include the input unit such as a keypad, a keyboard, or a mouse and the output unit such as a display or a printer. The power supply unit 1150 may supply an operating voltage which is necessary for operation of the electronic system 1100.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A memory device comprising:
   a substrate;
   a plurality of first conductive lines on the substrate, the plurality of first conductive lines extending in a first direction parallel to a top surface of the substrate and being spaced apart from each other in a second direction crossing the first direction;
   a plurality of second conductive lines over the plurality of first conductive lines, the plurality of second conductive lines extending in the second direction and being spaced apart from each other in the first direction;
   a plurality of third conductive lines over the plurality of second conductive lines, the plurality of third conductive lines extending in the first direction and being spaced apart from each other in the second direction;
   a plurality of first memory cells at respective intersections of the plurality of first conductive lines and the plurality of second conductive lines, each of the plurality of first memory cells including a first selection element layer and a first variable resistance layer; and
   a plurality of second memory cells at respective intersections of the plurality of second conductive lines and the plurality of third conductive lines, each of the plurality of second memory cells including a second selection element layer and a second variable resistance layer,
   wherein a first height of the first selection element layer in a third direction perpendicular to the first and second directions is different from a second height of the second selection element layer in the third direction, and
   wherein the first and second variable resistance layers are made of the same material, and the first and second selection element layers are made of the same material.

2. The memory device of claim 1, wherein a magnitude difference between a threshold voltage of the first selection element layer and a threshold voltage of the second selection element layer is less than 10% of the threshold voltage of the first selection element layer.

3. The memory device of claim 1, wherein a magnitude of a threshold voltage of the first selection element layer ranges from 90% to 110% of a magnitude of a threshold voltage of the second selection element layer.

4. The memory device of claim 1, wherein the first height of the first selection element layer is greater than the second height of the second selection element layer.

5. The memory device of claim 4, wherein the memory device is configured such that a word line selection voltage is applied to one of plurality of the first conductive lines or to one of the plurality of third conductive lines and an inhibit voltage which is smaller than the word line selection voltage is applied to one of the plurality of second conductive lines.

6. The memory device of claim 4, wherein the second height of the second selection element layer ranges from 50% to 90% of the first height of the first selection element layer.

7. The memory device of claim 1, wherein the first height of the first selection element layer is smaller than the second height of the second selection element layer.

8. The memory device of claim 7, wherein the first height of the first selection element layer ranges from 50% to 90% of the second height of the second selection element layer.

9. The memory device of claim 7, wherein the memory device is configured such that a word line selection voltage is applied to one of the plurality of first conductive lines or to one of the plurality of third conductive lines and an inhibit voltage which is greater than the word line selection voltage is applied to one of the plurality of second conductive lines.

10. The memory device of claim 1, wherein each of the first selection element layer and the second selection element layer has an ovonic threshold switching property.

11. The memory device of claim 1, wherein each of the plurality of first memory cells further includes a first heating electrode layer between the first variable resistance layer and a corresponding one of the plurality of first conductive lines, and each of the plurality of second memory cells further includes a second heating electrode layer between the second variable resistance layer and a corresponding one of the plurality of third conductive lines.

12. The memory device of claim 1, wherein each of the plurality of first memory cells further includes a first heating electrode layer between the first variable resistance layer and a corresponding one of the plurality of second conductive lines, and each of the plurality of second memory cells further includes a second heating electrode layer between the second variable resistance layer and a corresponding one of the plurality of second conductive lines.

13. A memory device comprising:
    a substrate;
    a plurality of first conductive lines on the substrate, the plurality of first conductive lines extending in a first direction parallel to a top surface of the substrate and being spaced apart from each other in a second direction crossing the first direction;
    a plurality of second conductive lines over the plurality of first conductive lines, the plurality of second conductive lines extending in the second direction and being spaced apart from each other in the first direction;

a plurality of third conductive lines over the plurality of second conductive lines, the plurality of third conductive lines extending in the first direction and being spaced apart from each other in the second direction;

a plurality of first memory cells at respective intersections of the plurality of first conductive lines and the plurality of second conductive lines, each of the plurality of first memory cells including a first selection element layer and a first variable resistance layer which are sequentially stacked in a third direction perpendicular to the first and second directions; and a plurality of second memory cells at respective intersections of the plurality of second conductive lines and the plurality of third conductive lines, each of the plurality of second memory cells including a second selection element layer and a second variable resistance layer which are sequentially stacked in the third direction, wherein a thickness of the first selection element layer in the third direction is greater than a thickness of the second selection element layer in the third direction, and wherein the first and second variable resistance layers are made of the same material, and the first and second selection element layers are made of the same material.

14. The memory device of claim 13, wherein each of the first and second selection element layers and the variable resistance layers has at least one of chalcogen elements.

15. The memory device of claim 13, wherein the thickness of the second selection element layer in the third direction ranges from 50% to 90% of the thickness of the first selection element layer in the third direction.

16. A memory device comprising:
a substrate;
a first word line layer disposed on the substrate;
a common bit line layer disposed on the first word line layer;
a second word line layer disposed on the common bit line layer such that the common bit line layer is vertically between the first word line layer and the second word line layer;
a first memory cell layer including a first variable resistance layer and a first ovonic threshold switching layer stacked vertically, the first memory cell layer disposed between the first word line layer and the common bit line layer in a vertical direction; and
a second memory cell layer including a second variable resistance layer and a second ovonic threshold switching layer stacked vertically, the second memory cell layer disposed between the second word line layer and the common bit line layer in the vertical direction,
wherein the first and second variable resistance layers are made of the same material, and the first and second ovonic threshold switching layers are made of the same material, and
wherein a first thickness of the first ovonic threshold switching layer in the vertical direction is different from a second thickness of the second ovonic threshold switching layer in the vertical direction.

17. The memory device of claim 16, wherein either the first thickness of the first ovonic threshold switching layer ranges from 50% to 90% of the second thickness of the second ovonic threshold switching layer, or
wherein the second thickness of the second ovonic threshold switching layer ranges from 50% to 90% of the first thickness of the first ovonic threshold switching layer.

18. The memory device of claim 16, wherein each of the first and second variable resistance layers and ovonic threshold switching layers includes at least one of chalcogen elements.

19. The memory device of claim 16, further comprising a spacer covering sidewalls of the first and second ovonic threshold switching layer and/or sidewalls of the first and second variable resistance layers.

20. The memory device of claim 19, wherein each of the first and second variable resistance layers has either an L shape or I shape.

* * * * *